United States Patent
Wang et al.

(10) Patent No.: US 11,922,838 B2
(45) Date of Patent: Mar. 5, 2024

(54) DISPLAY PANEL AND CRACK DETECTION METHOD THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yu Wang, Beijing (CN); Yi Zhang, Beijing (CN); Tingliang Liu, Beijing (CN); Chang Luo, Beijing (CN); Hao Zhang, Beijing (CN); Huijuan Yang, Beijing (CN); Tinghua Shang, Beijing (CN); Yang Zhou, Beijing (CN); Pengfei Yu, Beijing (CN); Shun Zhang, Beijing (CN); Xiaofeng Jiang, Beijing (CN); Huijun Li, Beijing (CN); Linhong Han, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 235 days.

(21) Appl. No.: 17/628,228

(22) PCT Filed: Apr. 13, 2021

(86) PCT No.: PCT/CN2021/086756
§ 371 (c)(1),
(2) Date: Jan. 19, 2022

(87) PCT Pub. No.: WO2021/238464
PCT Pub. Date: Dec. 2, 2021

(65) Prior Publication Data
US 2022/0254285 A1    Aug. 11, 2022

(30) Foreign Application Priority Data
May 27, 2020 (CN) .......................... 202010463955.6

(51) Int. Cl.
*G09G 3/00* (2006.01)
*H10K 59/131* (2023.01)

(52) U.S. Cl.
CPC ........... *G09G 3/006* (2013.01); *H10K 59/131* (2023.02)

(58) Field of Classification Search
CPC G09G 3/00; G09G 3/006; G09G 3/20; G09G 3/22; G09G 3/30; G09G 3/32;
(Continued)

(56) References Cited

U.S. PATENT DOCUMENTS

| 2014/0176844 A1 | 6/2014 | Yanagisawa |
| 2016/0043010 A1 | 2/2016 | Kwak et al. |

(Continued)

FOREIGN PATENT DOCUMENTS

| CN | 105374311 A | 3/2016 |
| CN | 106206654 A | 12/2016 |

(Continued)

OTHER PUBLICATIONS

International Search Report for PCT/CN2021/086756 dated Jul. 5, 2021.

Primary Examiner — Hoai-An D. Nguyen
(74) Attorney, Agent, or Firm — Ling Wu; Stephen Yang; Ling and Yang Intellectual Property

(57) ABSTRACT

A display panel, comprising a first insulating structural layer, a first crack detection line, a second insulating structural layer and a second crack detection line which are sequentially arranged on a substrate, wherein the first crack detection line and the second crack detection line are both located in a peripheral area and are arranged around a display area, (Continued)

one end of the first crack detection line is configured to receive a detection signal, and the other end of the first crack detection line is configured to output a first output signal, and one end of the second crack detection line is configured to receive a detection signal and the other end of the second crack detection line is configured to output a second output signal.

20 Claims, 8 Drawing Sheets

(58) Field of Classification Search
CPC .............. G09G 3/3208; G09G 2300/00; G09G 2300/04; G09G 2300/0421; G09G 2300/043; G09G 2310/00; G09G 2310/02; G09G 2310/0264; G09G 2310/0291; H10K 59/00; H10K 59/10; H10K 59/12; H10K 59/131; H10K 59/408; H10K 59/88; H10K 71/00; H10K 71/70; H10K 2102/00; H10K 2102/301; H10K 2102/302
USPC ..................... 324/500, 537, 760.01
See application file for complete search history.

(56) References Cited

U.S. PATENT DOCUMENTS

| | | | |
|---|---|---|---|
| 2016/0351093 A1 | 12/2016 | Kim et al. | |
| 2017/0069239 A1 | 3/2017 | Kwon et al. | |
| 2018/0158894 A1* | 6/2018 | Park | H10K 71/70 |
| 2020/0161406 A1 | 5/2020 | Lee et al. | |
| 2021/0096677 A1 | 4/2021 | Zhang et al. | |
| 2021/0335974 A1 | 10/2021 | Zhou et al. | |
| 2022/0013048 A1* | 1/2022 | Kim | G09G 3/20 |
| 2023/0134939 A1* | 5/2023 | Zhang | G01M 5/0033 |
| | | | 324/760.01 |

FOREIGN PATENT DOCUMENTS

| | | | | |
|---|---|---|---|---|
| CN | 108417561 A | | 8/2018 | |
| CN | 109192072 A | | 1/2019 | |
| CN | 110136618 A | | 8/2019 | |
| CN | 209199078 U | | 8/2019 | |
| CN | 110415631 A | | 11/2019 | |
| CN | 110673766 A | | 1/2020 | |
| CN | 111189618 A | | 5/2020 | |
| CN | 111509026 A | | 8/2020 | |
| KR | 20190059708 A | * | 5/2019 | ............. G09G 3/006 |
| KR | 20220119222 A | * | 8/2022 | ............. G09G 3/006 |

* cited by examiner

Apply a detection signal to the first endpoint, receive a first output signal output from the second endpoint, and determine whether a position where the first crack detection line is located cracks according to the first output signal Apply detection signals to the ninth endpoint and the tenth endpoint, receive a second output signal output from the seventh endpoint and a fourth output signal output from the eighth endpoint, determine whether a position where the third series line is located cracks according to the second output signal, and determine whether a position where the fourth series line is located cracks according to the fourth output signal

FIG. 8

Apply detection signals to the third endpoint, the fourth endpoint, the ninth endpoint, and the tenth endpoint Receive a first output signal of the first endpoint, a third output signal of the second endpoint, a second output signal of the seventh endpoint, and a fourth output signal of the eighth endpoint, determine whether a position where the first series line is located cracks according to the first output signal, determine whether a position where the second series line is located cracks according to the third output signal, determine whether a position where the third series line is located cracks according to the second output signal, and determine whether a position where the fourth series line is located cracks according to the fourth output signal

FIG. 9

DISPLAY PANEL AND CRACK DETECTION METHOD THEREFOR, AND DISPLAY DEVICE

CROSS-REFERENCE TO RELATED APPLICATIONS

The present application is a U.S. National Phase Entry of International Application No. PCT/CN2021/086756 having an international filing date of Apr. 13, 2021, which claims the priority to the Chinese patent application No. 202010463955.6, entitled "Display Panel and Crack Detection Method therefor, and Display Device", filed to the CNIPA on May 27, 2020. The entire contents of the above-identified applications are hereby incorporated by reference.

TECHNICAL FIELD

Embodiments of the present disclosure relate to, but are not limited to, the field of display technologies, and in particular to a display panel and a crack detection method therefor, and a display apparatus.

BACKGROUND

With development of display apparatuses, an Organic Light-Emitting Diode (OLED) display technology has shown great potential. The OLED has a wide application space because of its excellent display performance, but with development of technologies, higher requirements are put forward for integration of a screen. A Flexible Multi-Layer On Cell (FMLOC) technology integrates a screen and touch control, which greatly improves an integration degree of a display apparatus. The FMLOC technology has become a development trend of the display industry.

A Panel Crack Detection (PCD) technology has been widely used in display panel detection. For a display panel using the FMLOC technology, if a location of a crack can't be distinguished by using the crack detection technology, it will not be conducive to accurate positioning of a crack in a process of product production and related defect analysis, which will reduce productivity and product performance.

SUMMARY

The below is a summary about the subject matter described in the present disclosure in detail. The summary is not intended to limit the scope of protection of the claims.

In one aspect, an embodiment of the present disclosure provides a display panel, which includes a display region and a peripheral region located at a periphery of the display region, and the display panel includes: a substrate; a first insulating structure layer, located on a side of the substrate; a first crack detection line, located on a side of the first insulating structure layer away from the substrate, wherein the first crack detection line is located in the peripheral region and disposed around the display region; a second insulating structure layer, located on a side of the first crack detection line away from the substrate; a second crack detection line, located on a side of the second insulating structure layer away from the substrate, wherein the second crack detection line is located in the peripheral region and disposed around the display region, wherein one end of the first crack detection line is configured to receive a detection signal and the other end is configured to output a first output signal, and one end of the second crack detection line is configured to receive a detection signal and the other end is configured to output a second output signal.

In some possible implementations, the peripheral region includes a first region provided with a bonding region, a second region opposite to the first region, and a third region and a fourth region connecting the first region and the second region and opposite to each other, the first crack detection line includes a first endpoint and a second endpoint located in the first region, and the first crack detection line is disposed in the first region, the second region, the third region, and the fourth region around the display region, and one of the first endpoint and the second endpoint is configured to receive a detection signal, and the other is configured to output a first output signal.

In some possible implementations, the peripheral region includes a first region provided with a bonding region, and a third region and a fourth region oppositely disposed on two sides of the first region, the first crack detection line includes a first series line and a second series line, wherein the first series line includes a first endpoint and a third endpoint located in the first region, the first series line is located in the first region and the third region, the second series line includes a second endpoint and a fourth endpoint located in the first region, and the second series line is located in the first region and the fourth region, one of the first endpoint and the third endpoint is configured to receive a detection signal, and the other is configured to output a first output signal, one of the second endpoint and the fourth endpoint is configured to receive a detection signal, and the other is configured to output a third output signal.

In some possible implementations, the display panel includes n columns of sub-pixels and n data lines located in the display region, and the n columns of sub-pixels are connected with the n data lines, the display panel further includes a fourth control unit and a test control terminal located in the first region, the third endpoint is configured to receive a detection signal, the fourth control unit is connected with the test control terminal, the first endpoint, and an x-th data line, the fourth control unit is configured to provide a signal of the first endpoint to the x-th data line under control of a signal of the test control terminal, to control a light-emitting state of an x-th column of sub-pixels, wherein x is a natural number, $1 \leq x \leq n$.

In some possible implementations, the display panel further includes a fifth control unit located in the first region, the fourth endpoint is configured to receive a detection signal, the fifth control unit is connected with the test control terminal, the second endpoint, and a y-th data line, and the fifth control unit is configured to provide a signal of the second endpoint to the y-th data line under control of a signal of the test control terminal, to control a light-emitting state of a y-th column of sub-pixels, wherein y is a natural number, $1 \leq y \leq n$.

In some possible implementations, the peripheral region includes a first region provided with a bonding region, a second region opposite to the first region, and a third region and a fourth region connecting the first region and the second region and opposite to each other, the second crack detection line includes a seventh endpoint and an eighth endpoint located in the first region, and the second crack detection line is disposed in the first region, the second region, the third region, and the fourth region around the display region, and one of the seventh endpoint and the eighth endpoint is configured to receive a detection signal, and the other is configured to output a second output signal.

In some possible implementations, the peripheral region includes a first region provided with a bonding region, and a third region and a fourth region oppositely disposed on two sides of the first region, the second crack detection line includes a third series line and a fourth series line, wherein the third series line includes a seventh endpoint and a ninth endpoint located in the first region, the third series line is located in the first region and the third region, the fourth series line includes an eighth endpoint and a tenth endpoint located in the first region, and the fourth series line is located in the first region and the fourth region, one of the seventh endpoint and the ninth endpoint is configured to receive a detection signal, and the other is configured to output a second output signal, one of the eighth endpoint and the tenth endpoint is configured to receive a detection signal, and the other is configured to output a fourth output signal.

In some possible implementations, the display panel includes n columns of sub-pixels and n data lines located in the display region, and the n columns of sub-pixels are connected with the n data lines, the display panel further includes a first control unit and a test control terminal located in the first region, the ninth endpoint is configured to receive a detection signal, the first control unit is connected with the test control terminal, the seventh endpoint, and an i-th data line, the first control unit is configured to provide a signal of the seventh endpoint to the i-th data line under control of a signal of the test control terminal, to control a light-emitting state of an i-th columns of sub-pixels, wherein i is a natural number, $1 \leq i \leq n$.

In some possible implementations, the display panel further includes a second control unit located in the first region, the tenth endpoint is configured to receive a detection signal, the second control unit is connected with the test control terminal, the eighth endpoint, and a j-th data line, and the second control unit is configured to provide a signal of the eighth endpoint to the j-th data line under control of a signal of the test control terminal, to control a light-emitting state of a j-th column of sub-pixels, wherein j is a natural number, $1 \leq j \leq n$.

In some possible implementations, the display panel further includes multiple third control units and test data terminals located in the first region, each third control unit is connected with the test control terminal, a test data terminal and a data line, and the third control unit is configured to provide a signal of the test data terminal to a corresponding data line under control of a signal of the test control terminal, to control a corresponding column of sub-pixels to be in a first light-emitting state.

In some possible implementations, the display panel includes a driving structure layer located on a side of the substrate, the driving structure layer includes a thin film transistor, the first crack detection line is disposed in a same layer as a source-drain metal layer of the thin film transistor, and the first insulating structure layer includes an insulating layer disposed between adjacent layers of the thin film transistor; or, the display panel includes a driving structure layer located on a side of the substrate, the driving structure layer includes an active layer, a first gate insulating layer, a first gate metal layer, a second gate insulating layer, a second gate metal layer, an interlayer insulating layer, and a source-drain metal layer, the first crack detection line is disposed in a same layer as the source-drain metal layer, and the first insulating structure layer includes a first gate insulating layer, a second gate insulating layer, and an interlayer insulating layer; or, the display panel includes a driving structure layer located on a side of the substrate, the driving structure layer includes an active layer, a first gate insulating layer, a first gate metal layer, a second gate insulating layer, a second gate metal layer, an interlayer insulating layer, and a source-drain metal layer, the first crack detection line is disposed in a same layer as the second gate metal layer, and the first insulating structure layer includes a first gate insulating layer and a second gate insulating layer; or, the display panel includes a driving structure layer located on a side of the substrate, the driving structure layer includes an active layer, a first gate insulating layer, a first gate metal layer, a second gate insulating layer, a second gate metal layer, an interlayer insulating layer, and a source-drain metal layer, a part of the first crack detection line is disposed in a same layer as the source-drain metal layer and a part of the first crack detection line is disposed in a same layer as the second gate metal layer, and the first insulating structure layer includes a first gate insulating layer and a second gate insulating layer.

In some possible implementations, the display panel includes a touch structure layer located on a side of the second insulating structure layer away from the substrate, the touch structure layer includes a transition metal layer, a touch insulating layer, and a touch electrode layer which are stacked, and the second crack detection line is disposed in a same layer as the touch electrode layer, or the second crack detection line is disposed in a same layer as the transition metal layer.

In another aspect, the present disclosure further provides a crack detection method of a display panel, the display panel includes a display region and a peripheral region located at a periphery of the display region. The display panel includes a substrate, a first insulating structure layer located on a side of the substrate, a first crack detection line located on a side of the first insulating structure layer away from the substrate, a second insulating structure layer located on a side of the first crack detection line away from the substrate, and a second crack detection line located on a side of the second insulating structure layer away from the substrate, the peripheral region includes a first region provided with a bonding region, a second region opposite to the first region, and a third region and a fourth region connecting the first region and the second region and opposite to each other, the first crack detection line includes a first endpoint and a second endpoint located in the first region, and the first crack detection line is disposed in the first region, the second region, the third region, and the fourth region around the display region, the second crack detection line includes a third series line and a fourth series line, wherein the third series line includes a seventh endpoint and a ninth endpoint located in the first region, the third series line is located in the first region and the third region, the fourth series line includes an eighth endpoint and a tenth endpoint located in the first region, and the fourth series line is located in the first region and the fourth region. The crack detection method includes: applying a detection signal to the first endpoint, receiving a first output signal output from the second endpoint, and determining whether a position where the first crack detection line is located cracks according to the first output signal; applying detection signals to the ninth endpoint and the tenth endpoint, receiving a second output signal output from the seventh endpoint and a fourth output signal output from the eighth endpoint, determining whether a position where the third series line is located cracks according to the second output signal, and determining whether a position where the fourth series line is located cracks according to the fourth output signal.

In some possible implementations, the display panel includes n columns of sub-pixels and n data lines located in the display region and the n columns of sub-pixels are connected with the n data lines. The display panel further includes a first control unit, a second control unit, and a test control terminal located in the first region. The first control unit is connected with the test control terminal, the seventh endpoint, and an i-th data line, and the second control unit is connected with the test control terminal, the eighth endpoint, and a j-th data line, wherein i and j are both natural numbers, 1≤i≤n, 1≤j≤n, i and j are different from each other. Applying a detection signal to the ninth endpoint, receiving a second output signal output from the seventh endpoint, and determining whether a position where the third series line is located cracks according to the second output signal, includes: applying a first level signal to the ninth endpoint, applying a turn-on signal to the test control terminal, and receiving, by the i-th data line, the second output signal output from the seventh endpoint, wherein when an i-th column of sub-pixels is in a first light-emitting state, the position where the third series line is located does not crack, and when the i-th column of sub-pixels is in a second light-emitting state, the position where the third series line is located cracks. Applying a detection signal to the tenth endpoint, receiving a fourth output signal output from the eighth endpoint, and determining whether a position where the fourth series line is located cracks according to the fourth output signal, includes: applying a first level signal to the tenth endpoint, applying a turn-on signal to the test control terminal, and receiving, by the j-th data line, the fourth output signal output from the eighth endpoint, wherein when a j-th column of sub-pixels is in a first light-emitting state, the position where the fourth series line is located does not crack, and when the j-th column of sub-pixels is in a second light-emitting state, the position where the fourth series line is located cracks.

In yet another aspect, the present disclosure further provides a crack detection method of a display panel, the display panel includes a display region and a peripheral region located at a periphery of the display region. The display panel includes a substrate, a first insulating structure layer located on a side of the substrate, a first crack detection line located on a side of the first insulating structure layer away from the substrate, a second insulating structure layer located on a side of the first crack detection line away from the substrate, and a second crack detection line located on a side of the second insulating structure layer away from the substrate, the peripheral region includes a first region provided with a bonding region and a third region and a fourth region oppositely disposed on two sides of the first region, the first crack detection line includes a first series line and a second series line, the second crack detection line includes a third series line and a fourth series line, the first series line includes a first endpoint and a third endpoint located in the first region, and the first series line is located in the first region and the third region, the second series line includes a second endpoint and a fourth endpoint located in the first region, the second series line is located in the first region and the fourth region, the third series line includes a seventh endpoint and a ninth endpoint located in the first region, the third series line is located in the first region and the third region, the fourth series line includes an eighth endpoint and a tenth endpoint located in the first region, and the fourth series line is located in the first region and the fourth region. The crack detection method includes: applying detection signals to the third endpoint, the fourth endpoint, the ninth endpoint, and the tenth endpoint; receiving a first output signal of the first endpoint, a third output signal of the second endpoint, a second output signal of the seventh endpoint and a fourth output signal of the eighth endpoint, determining whether a position where the first series line is located cracks according to the first output signal, determining whether a position where the second series line is located cracks according to the third output signal, determining whether a position where the third series line is located cracks according to the second output signal, and determining whether a position where the fourth series line is located cracks according to the fourth output signal.

In some possible implementations, the display panel includes n columns of sub-pixels and n data lines located in the display region, and the n columns of sub-pixels are connected with the n data lines, and the display panel further includes a first control unit, a second control unit, a fourth control unit, a fifth control unit, and a test control terminal located in the first region, wherein the first control unit is connected with the test control terminal, the seventh endpoint, and an i-th data line, and the second control unit is connected with the test control terminal, the eighth endpoint, and a j-th data line, the fourth control unit is connected with the test control terminal, the first endpoint, and an x-th data line, and the fifth control unit is connected with the test control terminal, the second endpoint, and a y-th data line, wherein i, j, x, and y are all natural numbers, 1≤i≤n, 1≤j≤n, 1≤x≤n, 1≤y≤n, and i, j, x, and y are different from each other. Receiving a first output signal of the first endpoint, and determining whether a position where the first series line is located cracks according to the first output signal, includes: receiving, by the x-th data line, the first output signal output from the first endpoint, wherein when an x-th column of sub-pixels is in a first light-emitting state, the position where the first series line is located does not crack, and when the x-th column of sub-pixels is in a second light-emitting state, the position where the first series line is located cracks. Receiving a third output signal of the second endpoint, and determining whether a position where the second series line is located cracks according to the third output signal, includes: receiving, by the y-th data line, the third output signal output from the second endpoint, wherein when a y-th column of sub-pixels is in a first light-emitting state, the position where the second series line is located does not crack, and when the y-th column of sub-pixels is in a second light-emitting state, the position where the second series line is located cracks. Receiving a second output signal of the seventh endpoint, and determining whether a position where the third series line is located cracks according to the second output signal, includes: receiving, by i-th data line, the second output signal output from the seventh endpoint, wherein when an i-th column of sub-pixels is in a first light-emitting state, the position where the third series line is located does not crack, and when the i-th column of sub-pixels is in a second light-emitting state, the position where the third series line is located cracks. Receiving a fourth output signal of the eighth endpoint, and determining whether a position where the fourth series line is located cracks according to the fourth output signal, includes: receiving, by the j-th data line, the fourth output signal output from the eighth endpoint, wherein when a j-th column of sub-pixels is in a first light-emitting state, the position where the fourth series line is located does not crack, and when the j-th column of sub-pixels is in a second light-emitting state, the position where the fourth series line is located cracks.

In yet another aspect, the present disclosure further provides a display apparatus, including the display panel described above.

Other features and advantages of technical solutions of the present disclosure will be set forth in the description which follows, and in part will become apparent from the description, or be learned by practice of the technical solutions of the present disclosure. Purposes and advantages of the technical solutions of the present disclosure may be achieved and obtained by structures specifically pointed out in the specification and drawings.

After reading and understanding the drawings and the detailed description, other aspects may be understood.

BRIEF DESCRIPTION OF DRAWINGS

The drawings are used to provide a further understanding of the technical solutions of the present disclosure, constitute a part of the description, are used together with the embodiments of the present disclosure to explain the technical solutions of the present disclosure, and do not constitute limitations to the technical solutions of the present disclosure.

FIG. 8 is a schematic diagram of a crack detection method of a display panel in an exemplary embodiment of the present disclosure.

FIG. 9 is a schematic diagram of a crack detection method of a display panel in an exemplary embodiment of the present disclosure.

DETAILED DESCRIPTION

Figure 1:
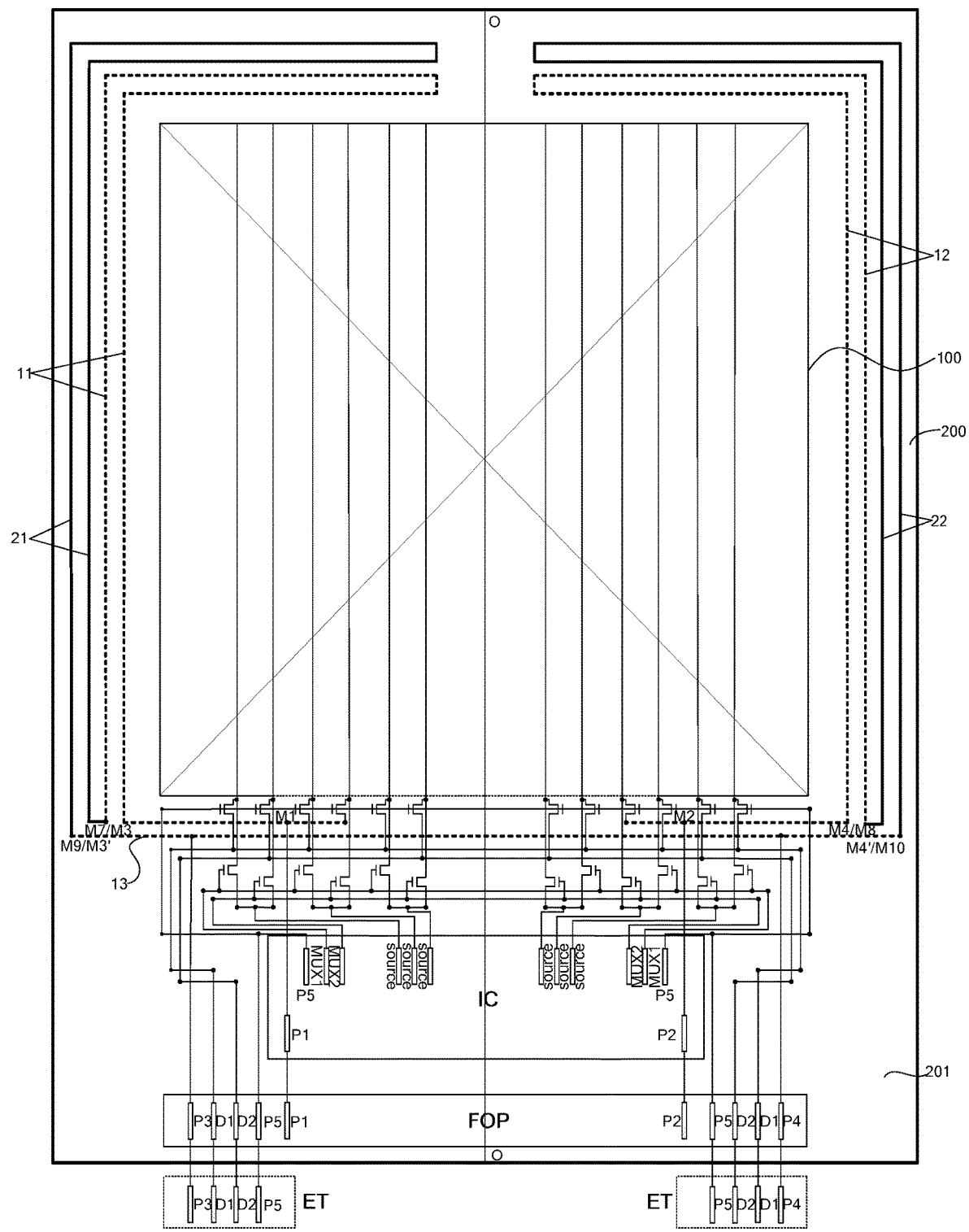
FIG. 1 is a schematic diagram of a planar structure of a display panel.

To make the objects, technical solutions and advantages of the present disclosure more clear, embodiments of the present disclosure will be described in detail below with reference to the drawings. The embodiments may be implemented in various forms. Those of ordinary skill in the art may easily understand a fact that manners and contents may be transformed into various forms without departing from the purposes and scope of the present disclosure. Therefore, the present disclosure should not be interpreted as being limited to the contents recorded in the following implementations only. The embodiments in the present disclosure and features in the embodiments may be combined with each other arbitrarily if there is no conflict.

In the drawings, sometimes for clarity, sizes of various constituent elements, a thickness of a layer or a region may be exaggerated. Therefore, implementations of the present disclosure are not necessarily limited to the sizes, and the shapes and magnitudes of the components in the drawings do not reflect true proportions. In addition, the drawings schematically show ideal examples, and implementations of the present disclosure are not limited to the shapes or values shown in the drawings.

The ordinal numerals such as "first", "second" and "third" in the present disclosure are set to avoid the confusion of constituent elements, but not to limit the quantity.

In the present disclosure, for convenience, the expressions "central", "above", "below", "front", "back", "vertical", "horizontal", "top", "bottom", "inside", "outside", etc., indicating orientations or positional relationships are used for describing positional relationships between constituent elements with reference to the drawings. They are only for convenience of describing this specification and simplifying description, and do not indicate or imply that involved apparatuses or elements must have specific orientations and be structured and operated with the specific orientations, and thus should not be understood as limitations to the present disclosure. The positional relationship between constituent elements may be appropriately varied according to the direction of the described constituent elements. Therefore, appropriate replacements based on situations are allowed, not limited to the expressions in the specification.

In the present disclosure, unless otherwise specified and limited, the terms "mount", "connected" and "connect" shall be understood in a broad sense. For example, it may be fixed connection, removable connection, or integrated connection; it may be mechanical connection or electrical connection; it may be direct connection, indirect connection through an intermediate component, or communication inside two components. For those skilled in the art, the meanings of the above terms in the present disclosure may be understood according to the situation.

In the present disclosure, a transistor refers to an element which includes at least three terminals, i.e., a gate electrode, a drain electrode, and a source electrode. The transistor has a channel region between the drain electrode (drain electrode terminal, drain region, or drain electrode) and the source electrode (source electrode terminal, source region, or source electrode), and a current can flow through the drain electrode, the channel region, and the source electrode. In this specification, the channel region refers to a region which the current mainly flows through.

In the present disclosure, a first electrode may be a drain electrode and a second electrode may be a source electrode, or a first electrode may be a source electrode and a second electrode may be a drain electrode. In a case that transistors with opposite polarities are used, or in a case that a direction of a current changes during work of a circuit, or the like, functions of the "source electrode" and the "drain electrode" may sometimes be exchanged. Therefore, the "source electrode" and the "drain electrode" may be exchanged in the present specification.

In the present disclosure, "electrical connection" includes a case where constituent elements are connected together through a component with a certain electrical action. "The element with the certain electric action" is not particularly limited as long as electric signals between the connected composition elements may be sent and received. Examples of "the element with the certain electric action" not only include an electrode and a wiring, but also include a switch element such as a transistor, a resistor, an inductor, a capacitor, and other elements with various functions, etc.

In the present disclosure, "parallel" refers to a state in which an angle formed by two straight lines is more than −10° and less than 10°. Therefore, it also includes a state in which the angle is more than −5° and less than 5°. In addition, "vertical" refers to a state in which an angle formed by two straight lines is more than 80° and less than 100°. Therefore, it also includes a state in which an angle is more than 85° and less than 95°.

FIG. 1 is a schematic diagram of a planar structure of a display panel, which is a display panel using the FMLOC technology. The display panel may include a display substrate and a touch structure layer located on the display substrate. The display substrate may include a substrate, a driving structure layer located on the substrate, a light-emitting structure layer located on a side of the driving structure layer away from the substrate, and an encapsulation layer located on a side of the light-emitting structure layer away from the substrate. The touch structure layer is located on a side of the encapsulation layer away from the substrate. The driving structure layer may include an active layer, a first gate insulating layer, a first gate electrode layer, a second gate insulating layer, a second gate electrode layer, an interlayer insulating layer, and a source-drain electrode layer. The touch structure layer may include a transition metal layer, a touch insulating layer, and a touch electrode layer which are sequentially stacked. As shown in FIG. 1, the display panel includes a display region 100 and a peripheral region 200 located at a periphery of the display region 100. The display panel further includes a first crack detection line, which is located in the peripheral region 200 and disposed around the display region 100. The first crack detection line may include a first series line 11, a second series line 12, and a fifth line segment 13. The first crack detection line may be disposed in a same layer as the source-drain electrode layer or the second gate electrode layer. The display panel further includes a second crack detection line, which is located in the peripheral region 200 and disposed around the display region 100. The second crack detection line may include a third series line 21 and a fourth series line 22. The second crack detection line may be disposed in a same layer as the touch electrode layer.

As shown in FIG. 1, a third endpoint M3 of the first series line 11 is connected with a seventh endpoint M7 of the third series line 21 through a via hole of the peripheral region 200, a ninth endpoint M9 of the third series line 21 is connected with an endpoint M3' of the fifth line segment 13 through a via hole of the peripheral region 200, the other endpoint M4' of the fifth line segment 13 is connected with a tenth endpoint M10 of the fourth series line 22 through a via hole of the peripheral region 200, and an eighth endpoint M8 of the fourth series line 22 is connected with a fourth endpoint M4 of the second series line 12 through a via hole of the peripheral region 200. Therefore, the first crack detection line and the second crack detection line are connected in series as a whole loop.

During crack detection, a detection signal may be applied to a first endpoint M1 through a first welding pad P1, and an output signal of a second endpoint M2 may be received through a second welding pad P2, and whether the display panel cracks may be determined according to a state of the output signal. When it is determined that the peripheral region 200 of the display panel cracks, since the second crack detection line and the first crack detection line are connected in series as a whole loop, it cannot be determined whether the crack is at a position where the first crack detection line is located (the display substrate) or a position where the second crack detection line is located (the touch structure layer).

During crack detection, detection signals may further be applied through a third welding pad P3 and a fourth welding pad P4, and when a bright line appears in the display region of the display panel, it is determined that the display panel cracks. However, since the first series line 11 and the third series line 21 are connected in series as a whole, and the second series line 12 and the third series line 22 are connected in series as a whole, although it may be determined whether the left and right sides of the display panel crack, it still cannot be determined whether the crack is on the display substrate or the touch structure layer.

Therefore, with the display panel shown in FIG. 1, although wirings of the first crack detection line and the second crack detection line are simple and it can be determined whether the peripheral region of the display panel cracks, only crack detection of the display substrate and the touch structure layer as a whole can be performed, separate crack detection cannot be performed, and a location of a crack cannot be determined, which is not conducive to accurate positioning of a crack in a process of product production and related defect analysis, thereby reducing productivity and product performance.

Figure 2:
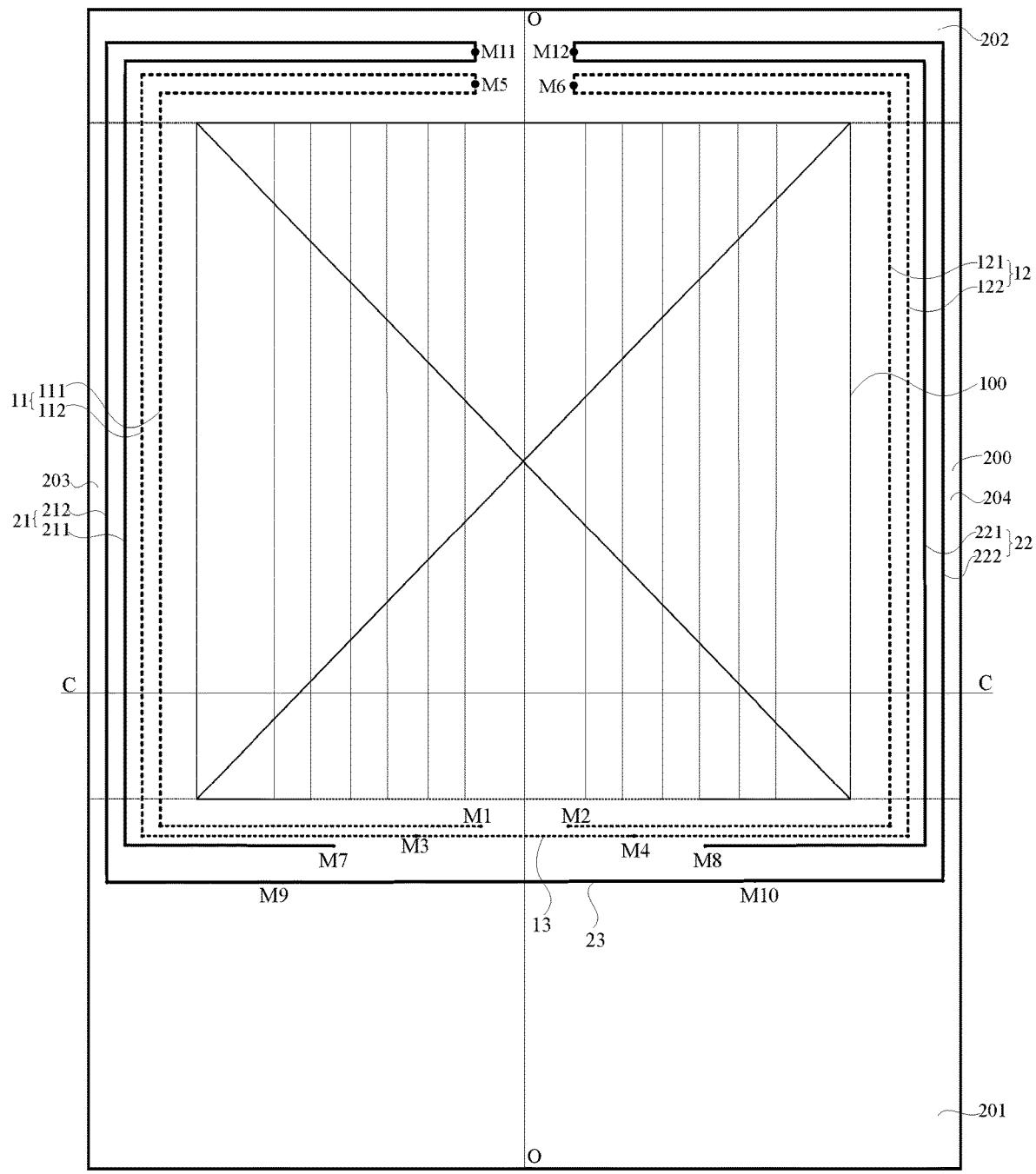
FIG. 2 is a schematic diagram of a planar structure of a display panel in an exemplary embodiment of the present disclosure.
Figure 3:
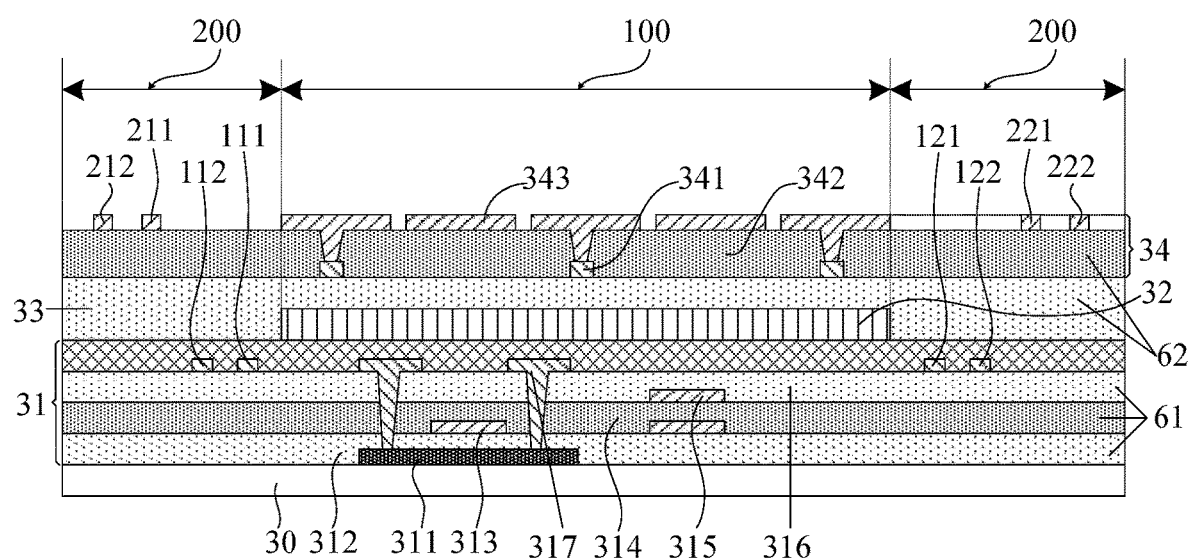
FIG. 3 is a schematic diagram of a cross-sectional structure of C-C in FIG. 2.

FIG. 2 is a schematic diagram of a planar structure of a display panel in an exemplary embodiment of the present disclosure, and FIG. 3 is a schematic diagram of a cross-sectional structure of C-C in FIG. 2. In an exemplary embodiment, as shown in FIGS. 2 and 3, the display panel includes a display region 100 and a peripheral region 200 located at a periphery of the display region 100. In a direction perpendicular to the display panel, the display panel may include a substrate 30, a first insulating structure layer 61 located on a side of the substrate 30, a first crack detection line located on a side of the first insulating structure layer 61 away from the substrate 30, a second insulating structure layer 62 located on a side of the first crack detection line away from the substrate 30, and a second crack detection line located on a side of the second insulating structure layer 62 away from the substrate 30. The first crack detection line is located in the peripheral region 200 and disposed around the display region 100, and the second crack detection line is located in the peripheral region 200 and disposed around the display region 100. One end of the first crack detection line is configured to receive a detection signal, and the other end is configured to output a first output signal. One end of the second crack detection line is configured to receive a detection signal, and the other end is configured to output a second output signal.

In the display panel according to this embodiment, the first crack detection line and the second crack detection line are located in different layers, and the first crack detection line is configured to receive a detection signal at one end and generate a first output signal at the other end; the second crack detection line is configured to receive a detection signal at one end and generate a second output signal at the other end, so that it may be determined whether a position where the first crack detection line is located cracks according to the first output signal, and whether a position where the second crack detection line is located cracks according to the second output signal, thus achieving separate crack detection at the position where the first crack detection line is located and the position where the second crack detection line is located, thereby a position of a crack can be detected, which is beneficial to accurate positioning of a crack in a process of product production and related defect analysis, and improving productivity and product performance.

In an exemplary embodiment, as shown in FIG. 3, the display panel includes a driving structure layer 31 located on a side of the substrate 30, a light-emitting structure layer 32 located on a side of the driving structure layer 31 away from the substrate 30, an encapsulation layer 33 located on a side of the light-emitting structure layer 32 away from the substrate 30, and a touch structure layer 34 located on a side of the encapsulation layer 33 away from the substrate 30.

In an exemplary embodiment, as shown in FIG. 3, the driving structure layer 31 includes a thin film transistor, the first crack detection line is disposed in a same layer as a source-drain metal layer of the thin film transistor, and the first insulating structure layer may include an insulating layer disposed between adjacent layers of the thin film transistor. For example, the driving structure layer may include an active layer located on the substrate, a gate insulating layer located on the active layer, a gate metal layer located on the gate insulating layer, an interlayer insulating layer located on the gate metal layer, and a source-drain metal layer located on the interlayer insulating layer, and the first crack detection line is located on the interlayer insulating layer. The first insulating structure layer includes a gate insulating layer and an interlayer insulating layer which are sequentially stacked in the peripheral region.

In an exemplary embodiment, as shown in FIG. 3, the driving structure layer 31 may include an active layer 311, a first gate insulating layer 312, a first gate metal layer 313, a second gate insulating layer 314, a second gate metal layer 315, an interlayer insulating layer 316, and a source-drain metal layer 317 which are sequentially disposed on a side of the substrate 30. The first crack detection line is disposed in a same layer as the source-drain metal layer 317, and the first insulating structure layer 61 may include the first gate insulating layer 312, the second gate insulating layer 314, and the interlayer insulating layer 316 which are sequentially stacked in the peripheral region 200.

In an exemplary embodiment, as shown in FIG. 3, the first crack detection line may be disposed in a same layer as the second gate metal layer 315, and the first insulating structure layer 61 may include the first gate insulating layer 312 and the second gate insulating layer 314 which are sequentially stacked in the peripheral region 200.

In an exemplary embodiment, a part of the first crack detection line may be disposed in a same layer as the source-drain metal layer 317 and a part of the first crack detection line may be disposed in a same layer as the second gate metal layer 315. The first insulating structure layer may include the first gate insulating layer 312 and the second gate insulating layer 314 which are sequentially stacked in the peripheral region 200.

In an exemplary embodiment, as shown in FIG. 3, the touch structure layer 34 includes a transition metal layer 341, a touch insulating layer 342, and a touch electrode layer 343, which are sequentially stacked. The second crack detection line may be disposed in a same layer as the touch electrode layer 343, and the second insulating structure layer 62 may include the encapsulation layer 33 and the touch insulating layer 342 which are sequentially stacked in the peripheral region 200. In an exemplary embodiment, the second crack detection line may be disposed in a same layer as the transition metal layer 341, and the second insulating structure layer 62 may include the encapsulation layer 33 located in the peripheral region 200.

In an exemplary embodiment, as shown in FIG. 2, the peripheral region 200 includes a first region 201 provided with a bonding region, and a third region 203 and a fourth region 204 oppositely disposed on two sides of the first region 201. For better explanation, a central axis O-O located between the third region 203 and the fourth region 204 may be set on the display panel, and opposite sides of the central axis O-O are a first side near the third region 203 and a second side near the fourth region 204, respectively. In FIG. 2, the first side is a left side and the second side is a right side.

In an exemplary embodiment, as shown in FIG. 2, the first crack detection line includes a first series line 11 and a second series line 12. The first series line 11 includes a first endpoint M1 and a second endpoint M3 located in the first region 201, and the first series line 11 is located in the first region 201 and the third region 203. The second series line 12 includes a second endpoint M2 and a fourth endpoint M4 located in the first region 201, and the second series line 12 is located in the first region 201 and the fourth region 204.

In an exemplary embodiment, one of the first endpoint M1 and the third endpoint M3 is configured to receive a detection signal, and the other is configured to output a first output signal. One of the second endpoint M2 and the fourth endpoint M4 is configured to receive a detection signal, and the other is configured to output a third output signal. Whether a position where the first series line 11 is located cracks can be determined through the first output signal, and whether a position where the second series line 12 is located cracks can be determined through the third output signal.

In an exemplary embodiment, as shown in FIG. 2, the peripheral region 200 further includes a second region 202 opposite to the first region 201, and the first crack detection line further includes a fifth endpoint M5 and a sixth endpoint M6 located in the second region 202. The first endpoint M1 and the third endpoint M3 are located on a left side of the central axis O-O, while the second endpoint M2 and the fourth endpoint M4 are located on a right side of the central axis O-O. The fifth endpoint M5 is located on the left side of the central axis O-O, and the sixth endpoint M6 is located on the right side of the central axis O-O.

In an exemplary embodiment, as shown in FIG. 2, the first crack detection line includes a first series line 11 and a second series line 12. The first series line 11 includes a first line segment 111 from the first endpoint M1 to the fifth endpoint M5 through the third region 203 and a second line segment 112 from the fifth endpoint M5 to the third endpoint M3 through the third region 203. The first line segment 111 and the second line segment 112 are connected in series to form the first series line 11. The second series line 12 includes a third line segment 121 from the second endpoint M2 to the sixth endpoint M6 through the fourth region 204 and a fourth line segment 122 from the sixth endpoint M6 to the fourth endpoint M4 through the fourth region 204. The third line segment 121 and the fourth line segment 122 are connected in series to form the second series line 12.

In an exemplary embodiment, the first endpoint M1 and the second endpoint M2 may be infinitely close but electrically insulated from each other, the third endpoint M3 and the fourth endpoint M4 may be infinitely close but electrically insulated from each other, and the fifth endpoint M5 and the sixth endpoint M6 may be infinitely close but electrically insulated from each other. Therefore, the first crack detection line may cover the peripheral region as much as possible to ensure more comprehensive crack detection.

The first line segment, the second line segment, the third line segment, and the fourth line segment described herein may be straight lines or bent lines, which are not limited here. Series connection of line segments means that the line segments are connected end to end in sequence.

In an exemplary embodiment, the first series line 11 and the second series line 12 are insulated from each other, as shown in FIG. 2. The third endpoint M3 may be configured to receive a detection signal, and the first endpoint M1 may be configured to generate a first output signal. According to the first output signal generated by the first endpoint M1, it may be determined whether a position where the first series line 11 is located (that is, the peripheral region of the display substrate on the left side of the central axis O-O) cracks. For example, the first output signal may be compared with a first standard output signal. If a deviation between the first output signal generated by the first endpoint M1 and the first standard output signal is within a threshold range, it indicates that the position where the first series line 11 is located does not crack. If the deviation between the output signal generated by the first endpoint M1 and the first standard output signal exceeds the threshold range, it indicates that the position where the first series line 11 is located cracks.

Similarly, the fourth endpoint M4 may be configured to receive a detection signal, and the second endpoint M2 may be configured to generate a third output signal. According to the third output signal generated by the second endpoint M2, it may be determined whether a position where the second series line 12 is located (that is, the peripheral region of the display substrate on the right side of the central axis O-O) cracks. For example, the third output signal may be compared with a third standard output signal. If a deviation between the third output signal generated by the second endpoint M2 and the third standard output signal is within a threshold range, it indicates that the position where the second series line 12 is located does not crack. If the deviation between the output signal generated by the second endpoint M2 and the third standard output signal exceeds the threshold range, it indicates that the position where the second series line 12 is located cracks.

It may be understood by those skilled in the art that when a position where a series line is located does not crack, a resistance of the series line is relatively small, and the series line is in a conductive state. After one end of the series line receives a detection signal, a deviation between an output signal generated by the other end and a standard output signal is very small, and the deviation is within a threshold range. When a position where a series line is located cracks, the series line breaks at the crack, a resistance of the series line is relatively large, and a deviation between an output signal generated by the series line and a standard output signal is relatively large, and the deviation is larger than the threshold range. Those skilled in the art may understand that the standard output signal and the threshold range may be obtained through an experiment or test.

In an exemplary embodiment, the first output signal may be a resistance value of a corresponding series line, that is, it may be determined whether the position where the first series line is located cracks by detecting a resistance value of the first series line through the first endpoint M1 and the third endpoint M3. Similarly, it may be determined whether the position where the second series line is located cracks by detecting a resistance value of the second series line through the second endpoint M2 and the fourth endpoint M4.

In an exemplary embodiment, the detection signal may be a voltage signal, the first output signal may be a first output voltage, and the third output signal may be a third output voltage. It may be understood by those skilled in the art that the detection signal and the output signal may be other types of electrical signals, as long as whether a position where a corresponding series line is located cracks can be determined through the output signal.

In an exemplary embodiment, as shown in FIG. 2, the first crack detection line includes the first endpoint M1 and the second endpoint M2 located in the first region 201, and the first crack detection line is disposed in the first region 201, the second region 202, the third region 203, and the fourth region 204 around the display region 100. One of the first endpoint M1 and the second endpoint M2 is configured to receive a detection signal, and the other is configured to output a first output signal. Therefore, it may be determined through the first output signal whether a position where the first crack detection line is located cracks.

In an exemplary embodiment, as shown in FIG. 2, the first crack detection line may further include a fifth line segment 13 connecting the third endpoint M3 and the fourth endpoint M4, so that the first series line 11, the fifth line segment 13, and the second series line 12 are connected into one line. The first endpoint M1 may be configured to receive a detection signal, and the second endpoint M2 may be configured to generate a first output signal. According to an output signal generated by the second endpoint M2, it may be determined whether a position where the first crack detection line is located cracks. For example, the first output signal is compared with a first standard output signal, if a deviation between the first output signal generated by the second endpoint M2 and the first standard output signal is within a threshold range, it indicates that the position where the first crack detection line is located does not crack; if the deviation between the first output signal generated by the second endpoint M2 and the first standard output signal exceeds the threshold range, it indicates that the position where the first crack detection line is located cracks.

When the first endpoint M1 is configured to receive a detection signal and the second endpoint M2 is configured to generate a first output signal, it can be detected whether the peripheral region of the display substrate cracks, but a position of a crack in the peripheral region of the display substrate cannot be detected. When the third endpoint M3 is configured to receive a detection signal, the first endpoint M1 is configured to generate a first output signal, the fourth endpoint M4 is configured to receive a detection signal, and the second endpoint M2 is configured to generate a third output signal, it can be detected whether the peripheral region of the display substrate cracks, and it can be detected which side (left side or/and right side) of the peripheral region of the display substrate cracks.

In an exemplary embodiment, as shown in FIG. 2, the second crack detection line includes a third series line 21 and a fourth series line 22. The third series line 21 includes a seventh endpoint M7 and a ninth endpoint M9 located in the first region 201, and the third series line 21 is located in the first region 201 and the third region 203. The fourth series line 22 includes an eighth endpoint M8 and a tenth endpoint M10 located in the first region 201, and the fourth series line 22 is located in the first region 201 and the fourth region 204.

In an exemplary embodiment, one of the seventh endpoint M7 and the ninth endpoint M9 is configured to receive a detection signal, and the other is configured to output a second output signal. One of the eighth endpoint M8 and the tenth endpoint M10 is configured to receive a detection signal, and the other is configured to output a fourth output signal. Whether a position where the third series line 21 is located cracks can be determined through the second output signal, and whether a position where the fourth series line 22 is located cracks can be determined through the fourth output signal.

In an exemplary embodiment, as shown in FIG. 2, the second crack detection line 10 further includes an eleventh endpoint M11 and a twelfth endpoint M12. The seventh endpoint M7 and the ninth endpoint M9 are located on the left side of the central axis O-O, and the eighth endpoint M8 and the tenth endpoint M10 are located on the right side of the central axis O-O. The eleventh endpoint M11 and the twelfth endpoint M12 are located in the second region 202, the eleventh endpoint M11 is located on the left side of the central axis O-O, and the twelfth endpoint M12 is located on the right side of the central axis O-O.

In an exemplary embodiment, as shown in FIG. 2, the second crack detection line includes a third series line 21 and a fourth series line 22. The third series line 21 includes a sixth line segment 211 from the seventh endpoint M7 to the eleventh endpoint M11 through the third region 203, and a seventh line segment 212 from the eleventh endpoint M11 to the ninth endpoint M9 through the third region 203. The sixth line segment 211 and the seventh line segment 212 are connected in series to form the third series line 21. The fourth series line 22 includes an eighth line segment 221 from the eighth endpoint M8 to the twelfth endpoint M12 through the fourth region 204, and a ninth line segment 222 from the twelfth endpoint M12 to the tenth endpoint M10 through the fourth region 204. The eighth line segment 221 and the ninth line segment 222 are connected in series to form the fourth series line 22.

In an exemplary embodiment, the seventh endpoint M7 and the eighth endpoint M8 may be infinitely close but electrically insulated from each other, the ninth endpoint M9 and the tenth endpoint M10 may be infinitely close but electrically insulated from each other, and the eleventh endpoint M11 and the twelfth endpoint M12 may be infinitely close but electrically insulated from each other. Therefore, the second crack detection line may cover the peripheral region as much as possible to ensure more comprehensive crack detection.

The sixth line segment, the seventh line segment, the eighth line segment, and the ninth line segment described herein may be straight lines or bent lines, which are not limited here. Series connection of line segments means that the line segments are connected end to end in sequence.

In an exemplary embodiment, the third series line 21 and the fourth series line 22 are insulated from each other, as shown in FIG. 2. The ninth endpoint M9 may be configured to receive a detection signal, and the seventh endpoint M7 may be configured to generate a second output signal. According to the second output signal generated by the seventh endpoint M7, it may be determined whether a position where the second series line 11 is located (that is, the peripheral region of the touch structure layer on the left side of the central axis O-O) cracks. For example, the second output signal may be compared with a second standard output signal. If a deviation between the second output signal generated by the seventh endpoint M7 and the second standard output signal is within a threshold range, it indicates that the position where the second series line 21 is located does not crack. If the deviation between the second output signal generated by the seventh endpoint M7 and the second standard output signal exceeds the threshold range, it indicates that the position where the second series line 21 is located cracks.

Similarly, the tenth endpoint M10 may be configured to receive a detection signal, and the eighth endpoint M8 may be configured to generate a fourth output signal. According to the fourth output signal generated by the eighth endpoint M8, it may be determined whether a position where the fourth series line 22 is located (that is, the peripheral region of the touch structure layer on the right side of the central axis O-O) cracks. For example, the fourth output signal may be compared with a fourth standard output signal. If a deviation between the fourth output signal generated by the eighth endpoint M8 and the fourth standard output signal is within a threshold range, it indicates that the position where the fourth series line 22 is located does not crack. If the deviation between the fourth output signal generated by the eighth endpoint M8 and the fourth standard output signal exceeds the threshold range, it indicates that the position where the fourth series line 22 is located cracks.

It may be understood by those skilled in the art that when a position where a series line is located does not crack, a resistance of the series line is relatively small, and the series line is in a conductive state. After one end of the series line receives a detection signal, a deviation between an output signal generated by the other end and a standard output signal is very small, and the deviation is within a threshold range. When a position where a series line is located cracks, the series line breaks at the crack, a resistance of the series line is relatively large, and a deviation between an output signal generated by the series line and a standard output signal is relatively large, and the deviation is larger than the threshold range. Those skilled in the art may understand that the standard output signal and the threshold range may be obtained through an implementation or test.

In an exemplary embodiment, the second output signal may be a resistance value of a corresponding series line, that is, it may be determined whether the position where the third series line is located cracks by detecting a resistance value of the third series line through the seventh endpoint M7 and the ninth endpoint M9. Similarly, it may be determined whether the position where the fourth series line is located cracks by detecting a resistance value of the fourth series line through the eighth endpoint M8 and the tenth endpoint M10.

In an exemplary embodiment, the detection signal may be a voltage signal, the second output signal may be a second output voltage, and the fourth output signal may be a fourth output voltage. It may be understood by those skilled in the art that the detection signal and the output signal may be other types of electrical signals, as long as whether a position where a corresponding series line is located cracks can be determined through the output signal.

In an exemplary embodiment, as shown in FIG. 2, the second crack detection line includes the seventh endpoint M7 and the eighth endpoint M8 located in the first region 201, and the second crack detection line is disposed in the first region 201, the second region 202, the third region 203, and the fourth region 204 around the display region 100. One of the seventh endpoint M7 and the eighth endpoint M8 is configured to receive a detection signal, and the other is configured to output a second output signal. Therefore, it may be determined through the second output signal whether a position where the second crack detection line is located cracks.

In an exemplary embodiment, as shown in FIG. 2, the second crack detection line may further include a tenth line segment 23 connecting the ninth endpoint M9 and the tenth endpoint M10, so that the third series line 21, the tenth line segment 23, and the fourth series line 22 are connected into one line. The seventh endpoint M7 may be configured to receive a detection signal, and the eighth endpoint M8 may be configured to generate a second output signal. According to the second output signal generated by the eighth endpoint M8, it may be determined whether the position where the second crack detection line is located cracks. For example, the second output signal is compared with a second standard output signal, if a deviation between the second output signal generated by the eighth endpoint M8 and the second standard output signal is within a threshold range, it indicates that the position where the second crack detection line is located does not crack; if the deviation between the second output signal generated by the eighth endpoint M8 and the second standard output signal exceeds the threshold range, it indicates that the position where the second crack detection line is located cracks.

When the seventh endpoint M7 is configured to receive a detection signal and the eighth endpoint M8 is configured to generate a second output signal, it can be detected whether the peripheral region of the touch structure layer cracks, but a position of a crack in the peripheral region of the touch structure layer cannot be detected. When the ninth endpoint M9 is configured to receive a detection signal, the seventh endpoint M7 is configured to generate a second output signal, the tenth endpoint M10 is configured to receive a detection signal, and the eighth endpoint M8 is configured to generate a fourth output signal, it can be detected whether the peripheral region of the touch structure layer cracks, and it can be detected which side (left side or/and right side) of the peripheral region of the touch structure layer cracks.

Figure 4:
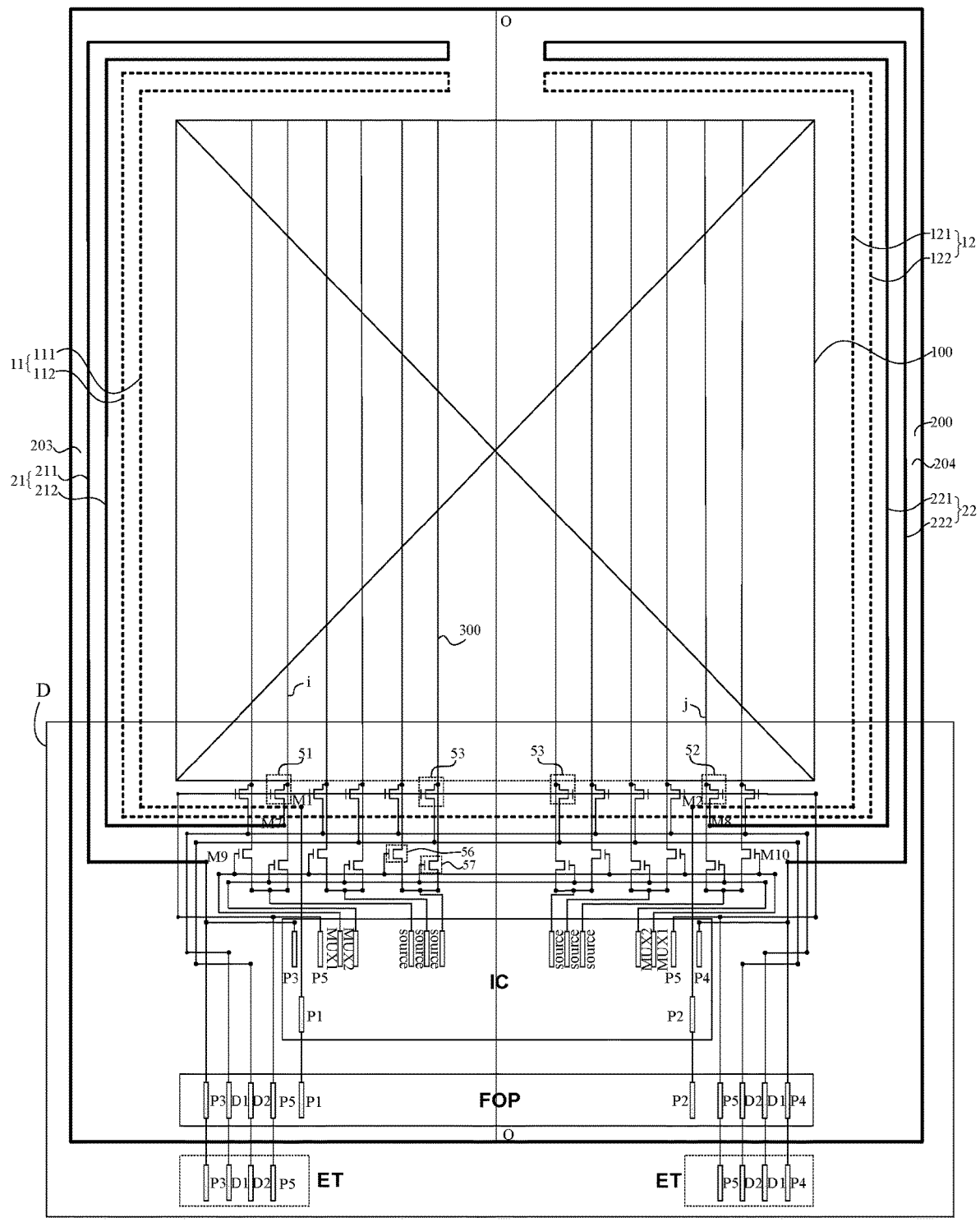
FIG. 4 is a schematic diagram of a planar structure of a display panel in an exemplary embodiment of the present disclosure.
Figure 5:
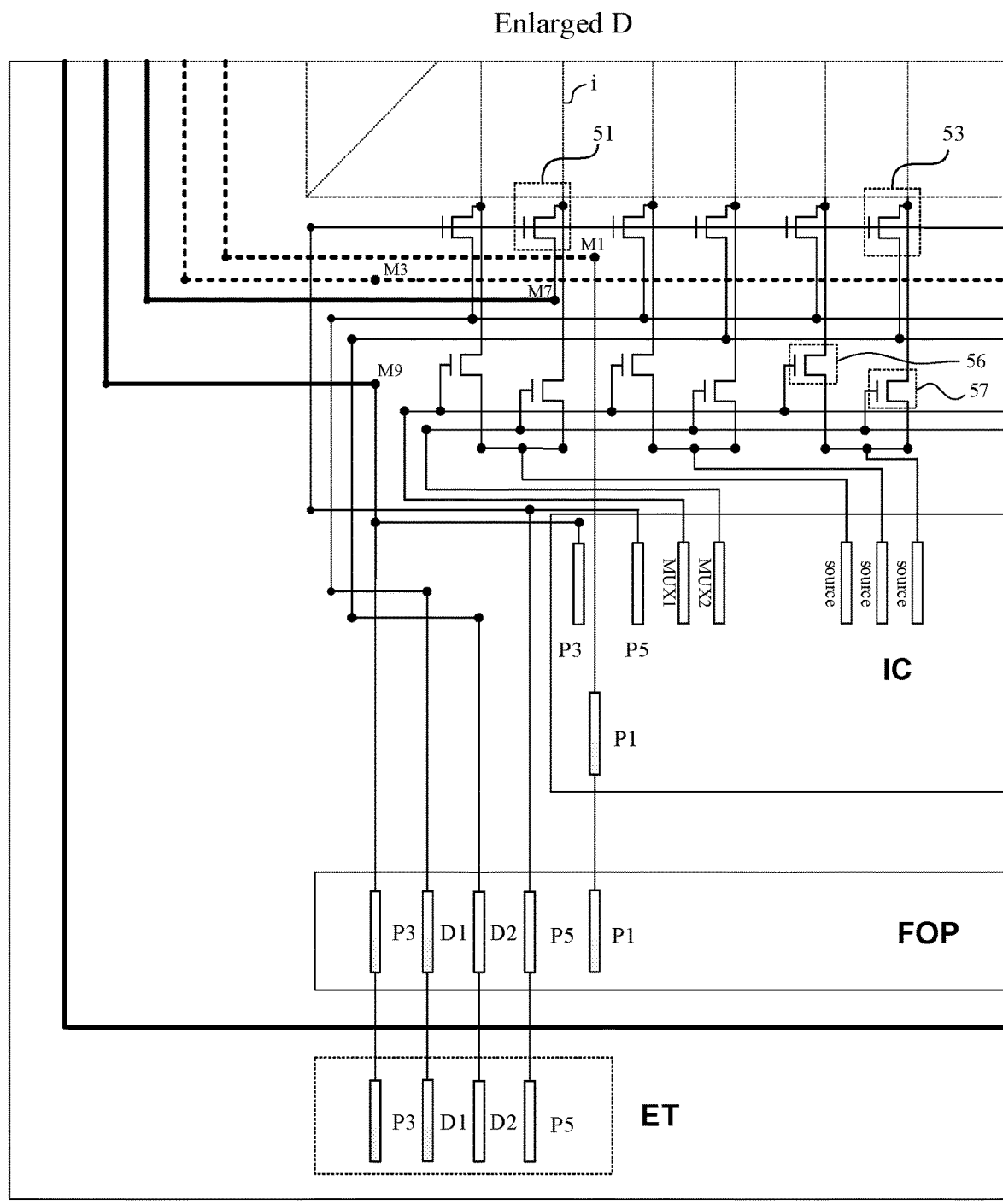
FIG. 5 is an enlarged schematic diagram of a portion D in FIG. 4.

FIG. 4 is a schematic diagram of a planar structure of a display panel in an exemplary embodiment of the present disclosure, and FIG. 5 is an enlarged schematic diagram of a portion D in FIG. 4. In an exemplary embodiment, as shown in FIGS. 4 and 5, the display panel includes a first welding pad P1 located in a first region 201, and a first endpoint M1 is connected with the first welding pad P1. The first endpoint M1 may receive or output a signal through the first welding pad P1. In an exemplary embodiment, as shown in FIGS. 4 and 5, the display panel further includes a second welding pad P2 located in the first region 201. The second endpoint M2 is connected with the second welding pad P2. The second endpoint M2 may output or receive a signal through the second welding pad P2. In an exemplary embodiment, the first endpoint M1 receives a detection signal through the first welding pad P1, and the second endpoint M2 outputs a first output signal through the second welding pad P2. In an exemplary embodiment, the second endpoint M2 receives a detection signal through the second welding pad P2, and the first endpoint M1 outputs a first output signal through the first welding pad P1.

In an exemplary embodiment, the display panel includes n columns of sub-pixels and n data lines 300 located in the display region 100, and the n data lines 300 are connected with the n columns of sub-pixels. In an exemplary embodiment, the n data lines 300 are connected with the n columns of sub-pixels in a one-to-one correspondence.

In an exemplary embodiment, the display panel further includes a third welding pad P3, a first control unit 51, and a test control terminal P5 located in the first region 201. A ninth endpoint M9 is connected with the third welding pad P3, and the ninth endpoint M9 receives a detection signal through the third welding pad P3. The first control unit 51 is electrically connected with the test control terminal P5, a seventh endpoint M7, and an i-th data line. The first control unit 51 is configured to provide a signal of the seventh endpoint M7 to the i-th data line under control of the test control terminal P5, to control a light-emitting state of an i-th column of sub-pixels corresponding to the i-th data line. Through the light-emitting state of the i-th column of sub-pixels, it is determined whether a position where a third series line 21 is located cracks.

For example, the ninth endpoint M9 receives a first level signal through the third welding pad P3. When the position where the third series line 21 is located does not crack, the first level signal is transmitted to the seventh endpoint M7 through the third series line 21. Under control of the test control terminal P5, the first control unit 51 provides a signal of the seventh endpoint M7 to the i-th data line, and the i-th column of sub-pixels is in a first light-emitting state under action of the i-th data line. When the position where the third series line 21 is located cracks, the first level signal cannot be transmitted to the seventh endpoint M7 through the third series line 21. At this time, the i-th column of sub-pixels is in a second light-emitting state under action of the i-th data line. Therefore, when the i-th column of sub-pixels is in the second light-emitting state, it is determined that the position where the third series line 21 is located cracks.

In an exemplary embodiment, the first light-emitting state may be a dark state and the second light-emitting state may be a bright state, that is, when the i-th column of sub-pixels is a bright line, it indicates that the position where the third series line 21 is located cracks.

In an exemplary embodiment, the display panel further includes a fourth welding pad P4 and a second control unit 52 located in the first region 201. A tenth endpoint M10 is connected with the fourth welding pad P4, and the tenth endpoint M10 receives a detection signal through the fourth welding pad P4. The second control unit 52 is electrically connected with the test control terminal P5, an eighth endpoint M8, and a j-th data line. The second control unit 52 is configured to provide a signal of the eighth endpoint M8 to the j-th data line under control of the test control terminal P5, to control a light-emitting state of a j-th column of sub-pixels corresponding to the j-th data line. Through the light-emitting state of the j-th column of sub-pixels, it is determined whether a position where a fourth series line 22 is located cracks.

For example, the tenth endpoint M10 receives a first level signal (e.g. +2.5V) through the fourth welding pad P4. When the position where the fourth series line 22 is located does not crack, the first level signal is transmitted to the eighth endpoint M8 through the fourth series line 22. Under control of the test control terminal P5, the second control unit 52 provides a signal of the eighth endpoint M8 to the j-th data line, and the j-th column of sub-pixels is in a first light-emitting state under action of the j-th data line. When the position where the fourth series line 22 is located cracks, the first level signal cannot be transmitted to the eighth endpoint M8 through the fourth series line 22. At this time, the j-th column of sub-pixels is in a second light-emitting state under action of the j-th data line. Therefore, when the j-th column of sub-pixels is in the second light-emitting state, it is determined that the position where the fourth series line 22 is located cracks.

In an exemplary embodiment, the first light-emitting state may be a dark state and the second light-emitting state may be a bright state, that is, when the j-th column of sub-pixels is a bright line, it indicates that the position where the fourth series line 22 is located cracks.

As can be understood by those skilled in the art, FIG. 4 only shows one first control unit 51 and one second control unit 52. But a quantity of first control units 51 and second control units 52 is not limited to one, and a quantity of first control units 51 may be multiple. Correspondingly, data lines of multiple columns of sub-pixels are respectively connected with multiple first control units 51 in a one-to-one correspondence. A quantity of second control units 52 may be multiple. Correspondingly, the data lines of multiple columns of sub-pixels are respectively connected with multiple second control units 51 in a one-to-one correspondence. In this way, when the position where the third series line is located cracks, multiple columns of sub-pixels will be in a second light-emitting state, and there will be multiple corresponding bright lines in the display region, which is easier to identify.

In an exemplary embodiment, a column of sub-pixels corresponding to the first control unit 51 and the third series line 21 may be located on a same side of a central axis O-O of the display panel. For example, the third series line 21 is located on a left side of the central axis O-O of the display panel, and the column of sub-pixels corresponding to the first control unit 51 is also located on the left side of the central axis O-O. A column of sub-pixels corresponding to the second control unit 52 and the fourth series line 22 may be located on a same side of the central axis O-O of the display panel. For example, the fourth series line 22 is located on a right side of the central axis O-O, and the column of sub-pixels corresponding to the second control unit 52 is also located on the right side of the central axis O-O.

In an exemplary embodiment, a series line and a corresponding column of sub-pixels are respectively disposed on opposite sides of the central axis O-O. For example, the third series line 21 is located on the left side of the central axis O-O, and a column of sub-pixels corresponding to the first control unit 51 is located on the right side of the central axis O-O; the fourth series line 22 is located on the right side of the central axis O-O, and a column of sub-pixels corresponding to the second control unit 52 is located on the left side of the central axis O-O.

In an exemplary embodiment, as shown in FIG. 4, the first control unit 51 may include a first thin film transistor, a control electrode of the first thin film transistor is connected with the test control terminal P5, a first electrode of the first thin film transistor is connected with the seventh endpoint M7, and a second electrode of the first thin film transistor is connected with the i-th data line. The second control unit 52 may include a second thin film transistor, a control electrode of the second thin film transistor is connected with the test control terminal P5, a first electrode of the second thin film transistor is connected with the eighth endpoint M8, and a second electrode of the second thin film transistor is connected with the j-th data line.

In an exemplary embodiment, as shown in FIG. 4, the display panel further includes multiple third control units 53 and test data terminals D (D1 or D2) located in the first region 201. Each third control unit 53 is electrically connected with the test control terminal P5, a test data terminal D, and a data line. The third control unit 53 is configured to provide a signal of the test data terminal D to a corresponding data line under control of the test control terminal P5, so that a corresponding column of sub-pixels is in a first light-emitting state (the first light-emitting state may be a dark state). For such a display panel, during crack detection, when the position where the second crack detection line is located does not crack, the display region of the display panel is in the dark state, and when the third series line 21 or the fourth series line 22 breaks, a bright line appears in the display region, and the bright line in a picture of the dark state is easier to identify.

For example, to detect the second crack detection line, a corresponding control signal (a turn-on signal) is applied to the test control terminal P5, so that the first control unit 51, the second control unit 52, and the third control unit 53 are all turned on, a first level signal is applied to a test data terminal D (D1 or D2), and a first level signal is applied to the third welding pad P3 and the fourth welding pad P4. When positions where the third series line 21 and the fourth series line 22 are located do not crack (that is, both the third series line 21 and the fourth series line 22 are conductive), the display region is in a first light-emitting state (dark state). When there is a bright line on the left side of the central axis O-O, it indicates that the third series line 21 breaks, and the position where the third series line 21 is located cracks. When there is a bright line on the right side of the central axis O-O, it indicates that the fourth series line 22 breaks, and the position where the fourth series line 22 is located cracks. In an exemplary embodiment, the first level signal may be a high-level signal (VGH). In other embodiments, the first level signal may be a low-level signal (VGL).

In an exemplary embodiment, the third control unit 53 may include a third thin film transistor, a control electrode of the third thin film transistor is connected with the test control terminal P5, a first electrode of the third thin film transistor is connected with a test data line D1 or D2, and a second electrode of the third thin film transistor is connected with a data line of a column of sub-pixels.

In an exemplary embodiment, as shown in FIG. 4, the first welding pad P1, the second welding pad P2, the third welding pad P3, the fourth welding pad P4, and the test control terminal P5 are all located in a driving Integrated Circuit (driving IC) bonding region IC. Therefore, the driving IC provides a detection signal to the first welding pad P1 and receives a first output signal output from the second welding pad P2. The driving IC provides a test control signal to the test control terminal P5 to control on or off of the first control unit 51, the second control unit 52, and the third control unit 53. The driving IC provides detection signals to the third welding pad P3 and the fourth welding pad P4.

In an exemplary embodiment, the test data terminals D1 and D2 are located in a Flexible Printed Circuit bonding region. Therefore, the Flexible Printed Circuit provides test data signals to the test data terminals D1 and D2.

In an exemplary embodiment, the first welding pad P1, the second welding pad P2, the third welding pad P3, the fourth welding pad P4, and the test control terminal P5 are all located in a Flexible Printed Circuit bonding region (FOP). Therefore, the Flexible Printed Circuit provides a detection signal to the first welding pad P1 and receives a first output signal output from the second welding pad P2. The Flexible Printed Circuit provides a test control signal to the test control terminal P5 to control on or off of the first control unit 51, the second control unit 52, and the third control unit 53. The Flexible Printed Circuit provides detection signals to the third welding pad P3 and the fourth welding pad P4.

In an exemplary embodiment, the test data terminals D1 and D2, the third welding pad P3, the fourth welding pad P4, and the test control terminal P5 are all located in a lighting test region (ET), so that corresponding electrical signals are provided to the test data terminals D1 and D2, the third welding pad P3, the fourth welding pad P4, and the test control terminal P5 through the lighting test region (ET).

As can be understood by those skilled in the art, a known driving circuit may be used in a sub-pixel driving circuit, as long as it can be satisfied that when a data line is provided with a first level signal, a sub-pixel is in a first light-emitting state.

In an exemplary embodiment, the first crack detection line and the second crack detection line may be detected simultaneously. For example, a detection signal is applied to the first endpoint M1 through the first welding pad P1, and at the same time, a detection signal is applied to the ninth endpoint M9 through the third welding pad P3, and a detection signal is applied to the tenth endpoint M10 through the fourth welding pad P4, thereby achieving simultaneous detection of the first crack detection line and the second crack detection line.

In an exemplary embodiment, the first crack detection line and the second crack detection line may be detected at separate time. For example, the first crack detection line is detected first, and then the second crack detection line is detected, or, the second crack detection line is detected first, and then the first crack detection line is detected. For example, a detection signal is applied to the first endpoint M1 through the first welding pad P1, and a second output signal output by the second endpoint M2 is received, and it is determined through the second output signal whether the position where the first crack detection line is located cracks; then, a detection signal is applied to the ninth endpoint M9 through the third welding pad P3, and a detection signal is applied to the tenth endpoint M10 through the fourth welding pad P4 to detect the second crack detection line.

In an exemplary embodiment, as shown in FIG. 4, the display panel may further include multiple sixth thin film transistors 56 and multiple seventh thin film transistors 57. A second electrode of each sixth thin film transistor 56 is connected with a data line of an odd column, and a second electrode of each seventh thin film transistor 57 is connected with a data line of an even column. A control electrode of the sixth thin film transistor 56 is connected with a first display control line MUX1, and a control electrode of the seventh thin film transistor 57 is connected with a second display control line MUX2. First electrodes of thin film transistors corresponding to two adjacent data lines are connected with a display data line (source).

In an exemplary embodiment, as shown in FIG. 4, in the display panel, wirings on the two sides of the central line O-O are symmetrical. It may be understood by those skilled in the art that in other embodiments, the wirings on the two sides of the central line O-O may be asymmetric.

In an exemplary embodiment, when crack detection of the display panel is performed, turn-off signals are applied to the first display control line MUX1 and the second display control line MUX2, so that both the sixth and seventh thin film transistors 56 and 57 are turned off; a turn-on signal is applied to the test control terminal P5, so that the first control unit 51, the second control unit 52, and the third control unit 53 are all turned on, and a signal of a data line is provided by a corresponding first control unit, second control unit, or third control unit; high-level signals (VGHs) are applied to the test data terminals D1 and D2, and crack detection may be performed.

When the display panel displays normally, a turn-off signal is applied to the test control terminal P5, and the first control unit, the second control unit, and the third control unit are all turned off; high-resistance state signals are applied to the first welding pad P1, the second welding pad P2, the third welding pad P3, and the fourth welding pad P4, so that the first crack detection line and the second crack detection line are both in a high-resistance state; high-level signals (VGHs) are applied to the test data terminals D1 and D2; turn-on signals are applied to the first display control line MUX1 and the second display control line MUX2, and a signal of a data line is provided by a corresponding sixth thin film transistor 56 or seventh thin film transistor 57, so that normal display of the display panel is achieved.

Figure 6:
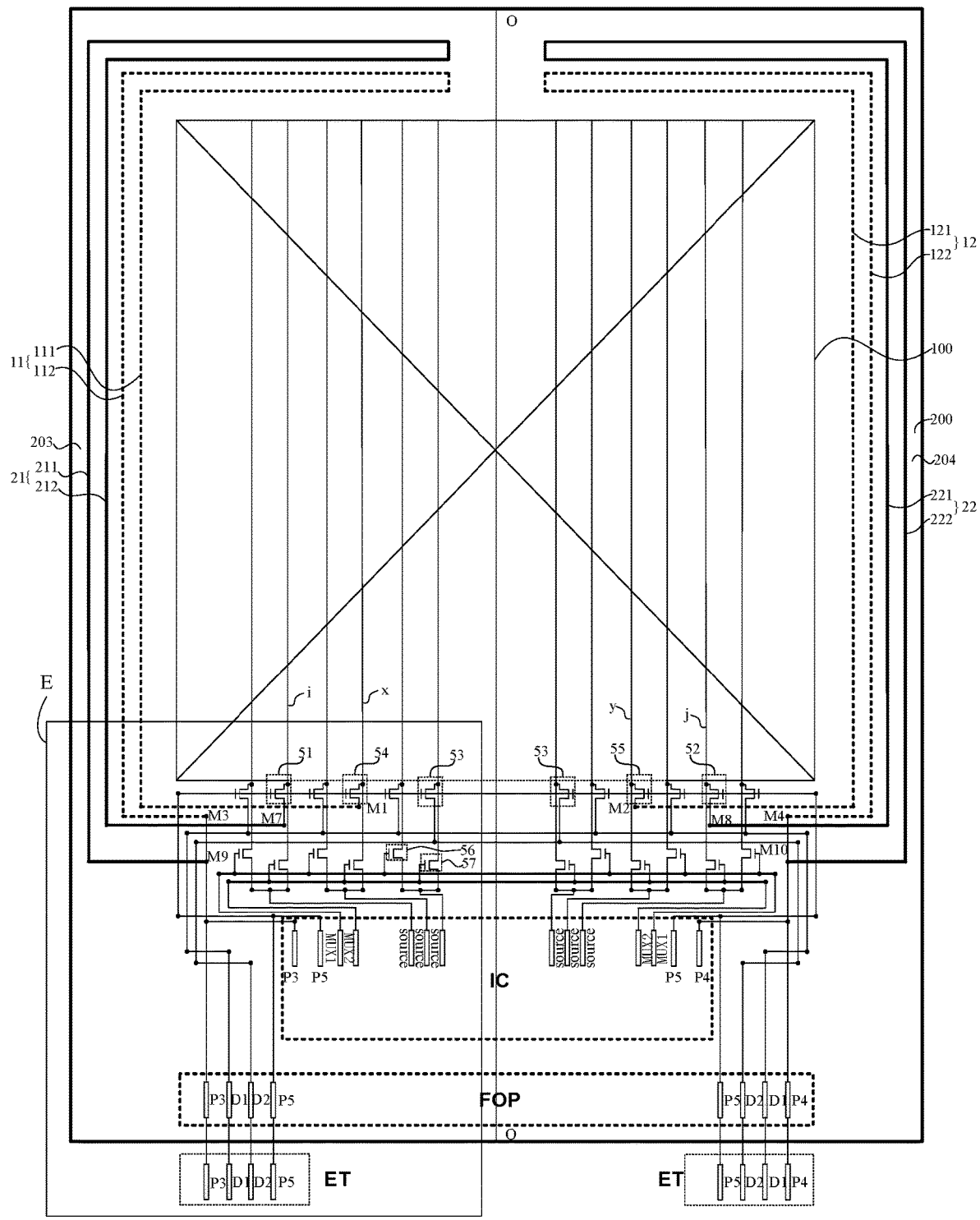
FIG. 6 is a schematic diagram of a planar structure of a display panel in an exemplary embodiment of the present disclosure.
Figure 7:
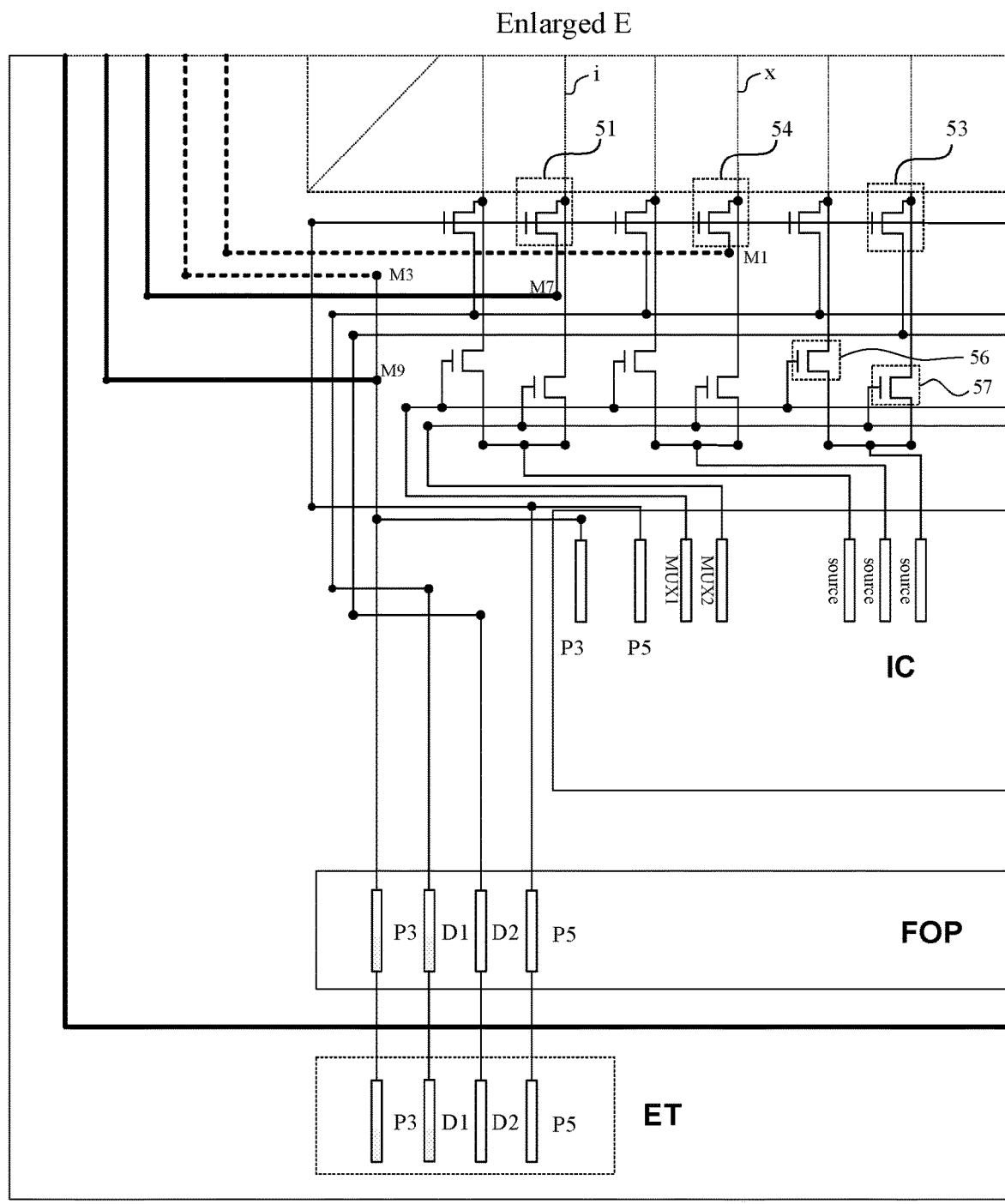
FIG. 7 is an enlarged schematic diagram of a portion E in FIG. 6.

FIG. 6 is a schematic diagram of a planar structure of a display panel in an exemplary embodiment of the present disclosure, and FIG. 7 is an enlarged schematic diagram of a portion E in FIG. 6. In an exemplary embodiment, as shown in FIGS. 6 and 7, the display panel may further include a fourth control unit 54 and a fifth control unit 55 located in a first region 201. A third endpoint M3 is connected with a third welding pad P3, and the third endpoint M3 receives a detection signal through the third welding pad P3. A fourth endpoint M4 is connected with a fourth welding pad P4, and the fourth endpoint M4 receives a detection signal through the fourth welding pad P4. The fourth control unit 54 is electrically connected with a test control terminal P5, a first endpoint M1, and an x-th data line. The fourth control unit 54 is configured to provide a signal of the first endpoint M1 to the x-th data line under control of the test control terminal P5, so as to control a light-emitting state of an x-th column of sub-pixels corresponding to the x-th data line. Through the light-emitting state of the x-th column of sub-pixels, it is determined whether a position where a first series line 11 is located cracks.

For example, the third endpoint M3 receives a first level signal through the third welding pad P3. When the position where the first series line 11 is located does not crack, the first level signal is transmitted to the first endpoint M1 through the first series line 11. Under control of the test control terminal P5, the fourth control unit 54 provides the signal of the first endpoint M1 to the x-th data line, and the x-th column of sub-pixels is in a first light-emitting state under action of the x-th data line. When the position where the first series line 11 is located cracks, the first level signal cannot be transmitted to the first endpoint M1 through the first series line 11. At this time, the x-th column of sub-pixels is in a second light-emitting state under action of the x-th data line. Therefore, when the x-th column of sub-pixels is in the second light-emitting state, it is determined that the position where the first series line 11 is located cracks. That is, when the x-th column of sub-pixels is a bright line, it indicates that the position where the first series line 11 is located cracks.

As shown in FIGS. 6 and 7, the fourth endpoint M4 is connected with the fourth welding pad P4, and the fourth endpoint M4 receives a detection signal through the fourth welding pad P4. The fifth control unit 55 is electrically connected with the test control terminal P5, a second endpoint M2, and a y-th data line. The fifth control unit 55 is configured to provide a signal of the second endpoint M2 to the y-th data line under control of the test control terminal P5, so as to control a light emitting state of a y-th column of sub-pixels corresponding to the y-th data line. Through the light-emitting state of the y-th column of sub-pixels, it is determined whether a position where a second series line 12 is located cracks.

For example, the fourth endpoint M4 receives a first level signal through the fourth welding pad P4. When the position where the second series line 12 is located does not crack, the first level signal is transmitted to the second endpoint M2 through the second series line 12. Under control of the test control terminal P5, the fifth control unit 55 provides the signal of the second endpoint M2 to the y-th data line, and the y-th column of sub-pixels is in a first light-emitting state under action of the y-th data line. When the position where the second series line 12 is located cracks, the first level signal cannot be transmitted to the second endpoint M2 through the second series line 12. At this time, the y-th column of sub-pixels is in a second light-emitting state under action of the y-th data line. Therefore, when the y-th column of sub-pixels is in the second light-emitting state, it is determined that the position where the second series line 12 is located cracks. That is, when the y-th column of sub-pixels is a bright line, it indicates that the position where the second series line 12 is located cracks.

As can be understood by those skilled in the art, FIG. 6 only shows one fourth control unit 54 and one fifth control unit 55. But a quantity of fourth control units 54 and fifth control units 55 is not limited to one, and a quantity of fourth control units 54 may be multiple. Correspondingly, data lines of multiple columns of sub-pixels are respectively connected with multiple fourth control units 54 in a one-to-one correspondence. A quantity of fifth control units 55 may be multiple. Correspondingly, data lines of multiple columns of sub-pixels are respectively connected with multiple fifth control units 55 in a one-to-one correspondence.

In an exemplary embodiment, a column of sub-pixels corresponding to the fourth control unit 54 and the first series line 11 may be located on a same side of a central axis of the display panel. For example, the first series line 11 is located on a left side of a central axis O-O of the display panel, and the column of sub-pixels corresponding to the fourth control unit 54 is also located on the left side of the central axis O-O. A column of sub-pixels corresponding to the fifth control unit 55 and the second series line 12 may be located on a same side of the central axis O-O of the display panel. For example, the second series line 12 is located on a right side of the central axis O-O, and the column of sub-pixels corresponding to the fifth control unit 55 is also located on the right side of the central axis O-O.

In an exemplary embodiment, a series line and a corresponding column of sub-pixels are respectively disposed on opposite sides of the central axis O-O. For example, the first series line 11 is located on the left side of the central axis O-O, and a column of sub-pixels corresponding to the fourth control unit 54 is located on the right side of the central axis O-O; the second series line 12 is located on the right side of the central axis O-O, and a column of sub-pixels corresponding to the fifth control unit 55 is located on the left side of the central axis O-O.

In an exemplary embodiment, as shown in FIG. 6, the fourth control unit 54 may include a fourth thin film transistor, a control electrode of the fourth thin film transistor is connected with the test control terminal P5, a first electrode of the fourth thin film transistor is connected with the first endpoint M1, and a second electrode of the fourth thin film transistor is connected with the x-th data line. The fifth control unit 55 may include a fifth thin film transistor, a control electrode of the fifth thin film transistor is connected with the test control terminal P5, a first electrode of the fifth thin film transistor is connected with the second endpoint M2, and a second electrode of the fifth thin film transistor is connected with the y-th data line.

In an exemplary embodiment, columns of sub-pixels corresponding to the first control unit 51 and the second control unit 52 are columns of sub-pixels of a first color, and columns of sub-pixels corresponding to the fourth control unit 54 and the fifth control unit 55 are columns of sub-pixels of a second color. The first color and the second color are two different colors. Therefore, a series line with a crack may be determined through a color of a bright line. For example, in a process of crack detection, when a bright line of the first color appears in the display region on the left side of the central axis O-O, it indicates that the position where the third series line 21 is located cracks, and when a bright line of the second color appears, it indicates that the position where the first series line 11 is located cracks.

Those skilled in the art may understand that colors of columns of sub-pixels corresponding to the first control unit 51, the second control unit 52, the fourth control unit 54, and the fifth control unit 55 may be set as needed, as long as it is easy to identify and judge, which is not limited here.

In an exemplary embodiment, as shown in FIG. 6, in the display panel, wirings on the two sides of the central line O-O are symmetrical. It may be understood by those skilled in the art that in other embodiments, wirings on the two sides of the central line O-O may be asymmetric.

Those skilled in the art may understand that the i, j, x, and y in the above description are all natural numbers and are different from each other. The display panel includes n columns of sub-pixels, and i, j, x, and y are all natural numbers between 1 and n and are different from each other.

Those skilled in the art may understand that the first, second, third, fourth, fifth, sixth, and seventh thin film transistors may all use P-type thin film transistors or N-type thin film transistors. When the P-type thin film transistor is used, a turn-on signal of the thin film transistor may be a low-level signal, such as −7V, and a turn-off signal may be a high-level signal, such as +7V. When the N-type thin film transistor is used, a turn-on signal of the thin film transistor may be a high-level signal, such as +7V, and a turn-off signal may be a low-level signal, such as −7V.

FIG. 8 is a schematic diagram of a crack detection method of a display panel in an exemplary embodiment of the present disclosure. In an exemplary embodiment, as shown in FIG. 4, the display panel includes a display region 100 and a peripheral region 200 located at a periphery of the display region 100. The display panel includes a substrate, a first insulating structure layer located on a side of the substrate, a first crack detection line located on a side of the first insulating structure layer away from the substrate, a second insulating structure layer located on a side of the first crack detection line away from the substrate, and a second crack detection line located on a side of the second insulating structure layer away from the substrate.

The peripheral region includes a first region provided with a bonding region, a second region opposite to the first region, and a third region and a fourth region connecting the first region and the second region and opposite to each other.

The first crack detection line includes a first endpoint and a second endpoint located in the first region, and the first crack detection line is disposed in the first region, the second region, the third region, and the fourth region around the display region.

The second crack detection line includes a third series line and a fourth series line, wherein the third series line includes a seventh endpoint and a ninth endpoint located in the first region, the third series line is located in the first region and the third region, the fourth series line includes an eighth endpoint and a tenth endpoint located in the first region, and the fourth series line is located in the first region and the fourth region.

As shown in FIG. 8, the crack detection method includes: applying a detection signal to the first endpoint, receiving a first output signal output from the second endpoint, and determining whether a position where the first crack detection line is located cracks according to the first output signal; applying detection signals to the ninth endpoint and the tenth endpoint, receiving a second output signal output from the seventh endpoint and a fourth output signal output from the eighth endpoint, determining whether a position where the third series line is located cracks according to the second output signal, and determining whether a position where the fourth series line is located cracks according to the fourth output signal.

As shown in FIG. 4, in an exemplary embodiment, the display panel includes n columns of sub-pixels and n data lines located in the display region and the n columns of sub-pixels are connected with the n data lines in a one-to-one correspondence. The display panel further includes a first control unit, a second control unit, and a test control terminal located in the first region. The first control unit is connected with the test control terminal, the seventh endpoint, and an i-th data line, and the second control unit is connected with the test control terminal, the eighth endpoint, and a j-th data line.

Applying a detection signal to the ninth endpoint, receiving a second output signal output from the seventh endpoint, and determining whether a position where the third series line is located cracks according to the second output signal, includes: applying a first level signal to the ninth endpoint, applying a turn-on signal to the test control terminal, and receiving, by the i-th data line, the second output signal output from the seventh endpoint, wherein when an i-th column of sub-pixels is in a first light-emitting state, the position where the third series line is located does not crack, and when the i-th column of sub-pixels is in a second light-emitting state, the position where the third series line is located cracks.

Applying a detection signal to the tenth endpoint, receiving a fourth output signal output from the eighth endpoint, and determining whether a position where the fourth series line is located cracks according to the fourth output signal, includes: applying a first level signal to the tenth endpoint, applying a turn-on signal to the test control terminal, and receiving, by the j-th data line, the fourth output signal output from the eighth endpoint, wherein when a j-th column of sub-pixels is in a first light-emitting state, the position where the fourth series line is located does not crack, and when the j-th column of sub-pixels is in a second light-emitting state, the position where the fourth series line is located cracks.

FIG. 9 is a schematic diagram of a crack detection method of a display panel in an exemplary embodiment of the present disclosure. As shown in FIG. 6, the display panel includes a display region and a peripheral region located at a periphery of the display region. The display panel includes a substrate, a first insulating structure layer located on a side of the substrate, a first crack detection line located on a side of the first insulating structure layer away from the substrate, a second insulating structure layer located on a side of the first crack detection line away from the substrate, and a second crack detection line located on a side of the second insulating structure layer away from the substrate.

The peripheral region includes a first region provided with a bonding region and a third region and a fourth region oppositely disposed on two sides of the first region, the first crack detection line includes a first series line and a second series line, the second crack detection line includes a third series line and a fourth series line, the first series line includes a first endpoint and a third endpoint located in the first region, and the first series line is located in the first region and the third region, the second series line includes a second endpoint and a fourth endpoint located in the first region, the second series line is located in the first region and the fourth region, the third series line includes a seventh endpoint and a ninth endpoint located in the first region, the third series line is located in the first region and the third region, the fourth series line includes an eighth endpoint and a tenth endpoint located in the first region, and the fourth series line is located in the first region and the fourth region.

As shown in FIG. 9, the crack detection method includes: applying detection signals to the third endpoint, the fourth endpoint, the ninth endpoint, and the tenth endpoint; receiving a first output signal of the first endpoint, a third output signal of the second endpoint, a second output signal of the seventh endpoint, and a fourth output signal of the eighth endpoint, determining whether a position where the first series line is located cracks according to the first output signal, determining whether a position where the second series line is located cracks according to the third output signal, determining whether a position where the third series line is located cracks according to the second output signal, and determining whether a position where the fourth series line is located cracks according to the fourth output signal.

In an exemplary embodiment, as shown in FIG. 6, the display panel includes n columns of sub-pixels and n data lines located in the display region and the n columns of sub-pixels and the n data lines are connected in a one-to-one correspondence.

The display panel further includes a first control unit, a second control unit, a fourth control unit, a fifth control unit, and a test control terminal located in the first region. The first control unit is connected with the test control terminal, the seventh endpoint, and an i-th data line, and the second control unit is connected with the test control terminal, the eighth endpoint, and a j-th data line. The fourth control unit is connected with the test control terminal, the first endpoint, and an x-th data line, and the fifth control unit is connected with the test control terminal, the second endpoint, and a y-th data line.

Receiving a first output signal of the first endpoint, and determining whether a position where the first series line is located cracks according to the first output signal, includes: receiving, by the x-th data line, the first output signal output from the first endpoint, wherein when an x-th column of sub-pixels is in a first light-emitting state, the position where the first series line is located does not crack, and when the x-th column of sub-pixels is in a second light-emitting state, the position where the first series line is located cracks.

Receiving a third output signal of the second endpoint, and determining whether a position where the second series line is located cracks according to the third output signal, includes: receiving, by the y-th data line, the third output signal output from the second endpoint, wherein when a y-th column of sub-pixels is in a first light-emitting state, the position where the second series line is located does not crack, and when the y-th column of sub-pixels is in a second light-emitting state, the position where the second series line is located cracks.

Receiving a second output signal of the seventh endpoint, and determining whether a position where the third series line is located cracks according to the second output signal, includes: receiving, by the i-th data line, the second output signal output from the seventh endpoint, wherein when an i-th column of sub-pixels is in a first light-emitting state, the position where the third series line is located does not crack, and when the i-th column of sub-pixels is in a second light-emitting state, the position where the third series line is located cracks.

Receiving a fourth output signal of the eighth endpoint, and determining whether a position where the fourth series line is located cracks according to the fourth output signal, includes: receiving, by the j-th data line, the fourth output signal output from the eighth endpoint, wherein when a j-th column of sub-pixels is in a first light-emitting state, the position where the fourth series line is located does not crack, and when the j-th column of sub-pixels is in a second light-emitting state, the position where the fourth series line is located cracks.

An embodiment of the present disclosure further provides a display apparatus including a display panel of a previous embodiment. The display apparatus may be any product or component with a display function, such as a mobile phone, a tablet computer, a television, a display, a laptop computer, a digital photo frame, a navigator, etc.

Although the implementations of the present disclosure are disclosed above, the contents are only implementations for easily understanding the present disclosure and not intended to limit the present disclosure. Any person skilled in the art to which the present disclosure pertains may make any modifications and changes in implementation forms and details without departing from the spirit and scope disclosed in the present disclosure. However, the scope of patent protection of the present disclosure is still subject to the scope defined by the appended claims.

The invention claimed is:

1. A display panel comprising a display region and a peripheral region located at a periphery of the display region, wherein the display panel comprises:
a substrate;
a first insulating structure layer, located on a side of the substrate;
a first crack detection line, located on a side of the first insulating structure layer away from the substrate, wherein the first crack detection line is located in the peripheral region and disposed around the display region;
a second insulating structure layer, located on a side of the first crack detection line away from the substrate;
a second crack detection line, located on a side of the second insulating structure layer away from the substrate, wherein the second crack detection line is located in the peripheral region and disposed around the display region,
wherein one end of the first crack detection line is configured to receive a detection signal and the other end is configured to output a first output signal, and one end of the second crack detection line is configured to receive a detection signal and the other end is configured to output a second output signal.

2. The display panel according to claim 1, wherein the peripheral region comprises a first region provided with a bonding region, a second region opposite to the first region, and a third region and a fourth region connecting the first region and the second region and opposite to each other,
the first crack detection line comprises a first endpoint and a second endpoint located in the first region, and the first crack detection line is disposed in the first region, the second region, the third region, and the fourth region around the display region, and one of the first endpoint and the second endpoint is configured to receive a detection signal, and the other is configured to output a first output signal.

3. The display panel according to claim 1, wherein the peripheral region comprises a first region provided with a bonding region, and a third region and a fourth region oppositely disposed on two sides of the first region, and the first crack detection line comprises a first series line and a second series line, wherein the first series line comprises a first endpoint and a third endpoint located in the first region, the first series line is located in the first region and the third region, the second series line comprises a second endpoint and a fourth endpoint located in the first region, and the second series line is located in the first region and the fourth region,
one of the first endpoint and the third endpoint is configured to receive a detection signal, and the other is configured to output a first output signal,
one of the second endpoint and the fourth endpoint is configured to receive a detection signal, and the other is configured to output a third output signal.

4. The display panel according to claim 3, wherein the display panel comprises n columns of sub-pixels and n data lines located in the display region and the n columns of sub-pixels are connected with the n data lines,
the display panel further comprises a fourth control unit and a test control terminal located in the first region, the third endpoint is configured to receive a detection signal, the fourth control unit is connected with the test control terminal, the first endpoint, and an x-th data line, the fourth control unit is configured to provide a signal of the first endpoint to the x-th data line under control of a signal of the test control terminal, to control a light-emitting state of an x-th column of sub-pixels, wherein x is a natural number, 1≤x≤n.

5. The display panel according to claim 4, wherein the display panel further comprises a fifth control unit located in the first region, the fourth endpoint is configured to receive a detection signal, the fifth control unit is connected with the test control terminal, the second endpoint, and a y-th data line, and the fifth control unit is configured to provide a signal of the second endpoint to the y-th data line under control of a signal of the test control terminal, to control a light-emitting state of a y-th column of sub-pixels, wherein y is a natural number, 1≤y≤n.

6. The display panel according to claim 1, wherein the peripheral region comprises a first region provided with a bonding region, a second region opposite to the first region, and a third region and a fourth region connecting the first region and the second region and opposite to each other,
the second crack detection line comprises a seventh endpoint and an eighth endpoint located in the first region, the second crack detection line is disposed in the first region, the second region, the third region, and the fourth region around the display region, and one of the seventh endpoint and the eighth endpoint is configured to receive a detection signal, and the other is configured to output a second output signal.

7. The display panel according to claim 1, wherein the peripheral region comprises a first region provided with a bonding region, and a third region and a fourth region oppositely disposed on two sides of the first region, and the second crack detection line comprises a third series line and a fourth series line, wherein the third series line comprises a seventh endpoint and a ninth endpoint located in the first region, the third series line is located in the first region and the third region, the fourth series line comprises an eighth endpoint and a tenth endpoint located in the first region, and the fourth series line is located in the first region and the fourth region,
one of the seventh endpoint and the ninth endpoint is configured to receive a detection signal, and the other is configured to output a second output signal,
one of the eighth endpoint and the tenth endpoint is configured to receive a detection signal, and the other is configured to output a fourth output signal.

8. The display panel according to claim 7, wherein the display panel comprises n columns of sub-pixels and n data lines located in the display region and the n columns of sub-pixels are connected with the n data lines,
the display panel further comprises a first control unit and a test control terminal located in the first region, the ninth endpoint is configured to receive a detection signal, the first control unit is connected with the test control terminal, the seventh endpoint, and an i-th data line, the first control unit is configured to provide a signal of the seventh endpoint to the i-th data line under control of a signal of the test control terminal, to control a light-emitting state of an i-th columns of sub-pixels, wherein i is a natural number, 1≤i≤n.

9. The display panel according to claim 8, wherein the display panel further comprises a second control unit located in the first region, the tenth endpoint is configured to receive a detection signal, the second control unit is connected with the test control terminal, the eighth endpoint, and a j-th data line, and the second control unit is configured to provide a signal of the eighth endpoint to the j-th data line under control of a signal of the test control terminal, to control a light-emitting state of a j-th column of sub-pixels, wherein j is a natural number, 1≤j≤n.

10. The display panel according to claim 7, wherein the display panel further comprises multiple third control units and test data terminals located in the first region, each third control unit is connected with the test control terminal, a test data terminal, and a data line, and the third control unit is configured to provide a signal of the test data terminal to a corresponding data line under control of a signal of the test control terminal, to control a corresponding column of sub-pixels to be in a first light-emitting state.

11. The display panel according to claim 1, wherein
the display panel comprises a driving structure layer located on a side of the substrate, the driving structure layer comprises a thin film transistor, the first crack detection line is disposed in a same layer as a source-drain metal layer of the thin film transistor, and the first insulating structure layer comprises an insulating layer disposed between adjacent layers of the thin film transistor; or,
the display panel comprises a driving structure layer located on a side of the substrate, the driving structure layer comprises an active layer, a first gate insulating layer, a first gate metal layer, a second gate insulating layer, a second gate metal layer, an interlayer insulating layer, and a source-drain metal layer, the first crack detection line is disposed in a same layer as the source-drain metal layer, and the first insulating structure layer comprises a first gate insulating layer, a second gate insulating layer, and an interlayer insulating layer; or,
the display panel comprises a driving structure layer located on a side of the substrate, the driving structure layer comprises an active layer, a first gate insulating layer, a first gate metal layer, a second gate insulating layer, a second gate metal layer, an interlayer insulating layer, and a source-drain metal layer, the first crack detection line is disposed in a same layer as the second gate metal layer, and the first insulating structure layer comprises a first gate insulating layer and a second gate insulating layer; or,
the display panel comprises a driving structure layer located on a side of the substrate, the driving structure layer comprises an active layer, a first gate insulating layer, a first gate metal layer, a second gate insulating layer, a second gate metal layer, an interlayer insulating layer, and a source-drain metal layer, a part of the first crack detection line is disposed in a same layer as the source-drain metal layer and a part of the first crack detection line is disposed in a same layer as the second gate metal layer, and the first insulating structure layer comprises a first gate insulating layer and a second gate insulating layer.

12. The display panel according to claim 1, wherein the display panel comprises a touch structure layer located on a side of the second insulating structure layer away from the substrate, the touch structure layer comprises a transition metal layer, a touch insulating layer, and a touch electrode layer which are stacked, and the second crack detection line is disposed in a same layer as the touch electrode layer, or the second crack detection line is disposed in a same layer as the transition metal layer.

13. A display apparatus, comprising the display panel according to claim 1.

14. The display panel according to claim 2, wherein the second crack detection line comprises a seventh endpoint and an eighth endpoint located in the first region, the second crack detection line is disposed in the first region, the second region, the third region, and the fourth region around the display region, and one of the seventh endpoint and the eighth endpoint is configured to receive a detection signal, and the other is configured to output a second output signal.

15. The display panel according to claim 3, wherein the second crack detection line comprises a third series line and a fourth series line, wherein the third series line comprises a seventh endpoint and a ninth endpoint located in the first region, the third series line is located in the first region and the third region, the fourth series line comprises an eighth endpoint and a tenth endpoint located in the first region, and the fourth series line is located in the first region and the fourth region,
one of the seventh endpoint and the ninth endpoint is configured to receive a detection signal, and the other is configured to output a second output signal,
one of the eighth endpoint and the tenth endpoint is configured to receive a detection signal, and the other is configured to output a fourth output signal.

16. The display panel according to claim 4, wherein the second crack detection line comprises a third series line and a fourth series line, wherein the third series line comprises a seventh endpoint and a ninth endpoint located in the first region, the third series line is located in the first region and the third region, the fourth series line comprises an eighth endpoint and a tenth endpoint located in the first region, and the fourth series line is located in the first region and the fourth region,
one of the seventh endpoint and the ninth endpoint is configured to receive a detection signal, and the other is configured to output a second output signal,
one of the eighth endpoint and the tenth endpoint is configured to receive a detection signal, and the other is configured to output a fourth output signal.

17. A crack detection method of a display panel, wherein the display panel comprises a display region and a peripheral region located at a periphery of the display region, the display panel comprises a substrate, a first insulating structure layer located on a side of the substrate, a first crack detection line located on a side of the first insulating structure layer away from the substrate, a second insulating structure layer located on a side of the first crack detection line away from the substrate, and a second crack detection line located on a side of the second insulating structure layer away from the substrate,
the peripheral region comprises a first region provided with a bonding region, a second region opposite to the first region, and a third region and a fourth region connecting the first region and the second region and opposite to each other,
the first crack detection line comprises a first endpoint and a second endpoint located in the first region, and the first crack detection line is disposed in the first region, the second region, the third region, and the fourth region around the display region, the second crack detection line comprises a third series line and a fourth series line, wherein the third series line comprises a seventh endpoint and a ninth endpoint located in the first region, the third series line is located in the first region and the third region, the fourth series line comprises an eighth endpoint and a tenth endpoint located in the first region, and the fourth series line is located in the first region and the fourth region, wherein the crack detection method comprises:

applying a detection signal to the first endpoint, receiving a first output signal output from the second endpoint, and determining whether a position where the first crack detection line is located cracks according to the first output signal;

applying detection signals to the ninth endpoint and the tenth endpoint, receiving a second output signal output from the seventh endpoint and a fourth output signal output from the eighth endpoint, determining whether a position where the third series line is located cracks according to the second output signal, and determining whether a position where the fourth series line is located cracks according to the fourth output signal.

18. The crack detection method according to claim 17, wherein the display panel comprises n columns of sub-pixels and n data lines located in the display region, and the n columns of sub-pixels are connected with the n data lines, the display panel further comprises a first control unit, a second control unit, and a test control terminal located in the first region, the first control unit is connected with the test control terminal, the seventh endpoint, and an i-th data line, and the second control unit is connected with the test control terminal, the eighth endpoint, and a j-th data line, wherein i and j are both natural numbers, $1 \leq i \leq n$, $1 \leq j \leq n$, i and j are different from each other, applying a detection signal to the ninth endpoint, receiving a second output signal output from the seventh endpoint, and determining whether a position where the third series line is located cracks according to the second output signal, comprises: applying a first level signal to the ninth endpoint, applying a turn-on signal to the test control terminal, and receiving, by the i-th data line, the second output signal output from the seventh endpoint, wherein when an i-th column of sub-pixels is in a first light-emitting state, the position where the third series line is located does not crack, and when the i-th column of sub-pixels is in a second light-emitting state, the position where the third series line is located cracks, applying a detection signal to the tenth endpoint, receiving a fourth output signal output from the eighth endpoint, and determining whether a position where the fourth series line is located cracks according to the fourth output signal, comprises: applying a first level signal to the tenth endpoint, applying a turn-on signal to the test control terminal, and receiving, by the j-th data line, the fourth output signal output from the eighth endpoint, wherein when a j-th column of sub-pixels is in a first light-emitting state, the position where the fourth series line is located does not crack, and when the j-th column of sub-pixels is in a second light-emitting state, the position where the fourth series line is located cracks.

19. A crack detection method of a display panel, wherein the display panel comprises a display region and a peripheral region located at a periphery of the display region, the display panel comprises a substrate, a first insulating structure layer located on a side of the substrate, a first crack detection line located on a side of the first insulating structure layer away from the substrate, a second insulating structure layer located on a side of the first crack detection line away from the substrate, and a second crack detection line located on a side of the second insulating structure layer away from the substrate, the peripheral region comprises a first region provided with a bonding region and a third region and a fourth region oppositely disposed on two sides of the first region, the first crack detection line comprises a first series line and a second series line, the second crack detection line comprises a third series line and a fourth series line, the first series line comprises a first endpoint and a third endpoint located in the first region, and the first series line is located in the first region and the third region, the second series line comprises a second endpoint and a fourth endpoint located in the first region, and the second series line is located in the first region and the fourth region, the third series line comprises a seventh endpoint and a ninth endpoint located in the first region, and the third series line is located in the first region and the third region, the fourth series line comprises an eighth endpoint and a tenth endpoint located in the first region, and the fourth series line is located in the first region and the fourth region, wherein the crack detection method comprises:

applying detection signals to the third endpoint, the fourth endpoint, the ninth endpoint, and the tenth endpoint;

receiving a first output signal of the first endpoint, a third output signal of the second endpoint, a second output signal of the seventh endpoint, and a fourth output signal of the eighth endpoint, determining whether a position where the first series line is located cracks according to the first output signal, determining whether a position where the second series line is located cracks according to the third output signal, determining whether a position where the third series line is located cracks according to the second output signal, and determining whether a position where the fourth series line is located cracks according to the fourth output signal.

20. The crack detection method according to claim 19, wherein the display panel comprises n columns of sub-pixels and n data lines located in the display region, and the n columns of sub-pixels are connected with the n data lines, the display panel further comprises a first control unit, a second control unit, a fourth control unit, a fifth control unit, and a test control terminal located in the first region, wherein the first control unit is connected with the test control terminal, the seventh endpoint, and an i-th data line, and the second control unit is connected with the test control terminal, the eighth endpoint, and a j-th data line, the fourth control unit is connected with the test control terminal, the first endpoint, and an x-th data line, and the fifth control unit is connected with the test control terminal, the second endpoint, and a y-th data line, wherein i, j, x, and y are all natural numbers, $1 \leq i \leq n$, $1 \leq j \leq n$, $1 \leq x \leq n$, $1 \leq y \leq n$, and i, j, x, and y are different from each other, receiving the first output signal of the first endpoint, and determining whether the position where the first series line is located cracks according to the first output signal, comprises: receiving, by x-th data line, the first output signal output from the first endpoint, wherein when an x-th column of sub-pixels is in a first light-emitting state, the position where the first series line is located does not crack, and when the x-th column of sub-pixels is in a second light-emitting state, the position where the first series line is located cracks, receiving the third output signal of the second endpoint, and determining whether the position where the second series line is located cracks according to the third output signal, comprises: receiving, by the y-th data line, the third output signal output from the second endpoint, wherein when a y-th column of sub-pixels is in a first light-emitting state, the position where the second series line is located does not crack, and when the y-th column of sub-pixels is in a second light-emitting state, the position where the second series line is located cracks, receiving the second output signal of the seventh endpoint, and determining whether the position where the third series line is located cracks according to the second output signal, comprises: receiving, by the i-th data line, the second output signal output from the seventh endpoint, wherein when an i-th column of sub-pixels is in a first light-emitting state, the position where the third series line is located does not crack, and when the i-th column of sub-pixels is in a second light-emitting state, the position where the third series line is located cracks, and receiving the fourth output signal of the eighth endpoint, and determining whether the position where the fourth series line is located cracks according to the fourth output signal, comprises: receiving, by the j-th data line, the fourth output signal output from the eighth endpoint, wherein when a j-th column of sub-pixels is in a first light-emitting state, the position where the fourth series line is located does not crack, and when the j-th column of sub-pixels is in a second light-emitting state, the position where the fourth series line is located cracks.

* * * * *